United States Patent
Chen et al.

(10) Patent No.: US 12,243,949 B2
(45) Date of Patent: Mar. 4, 2025

(54) SOLAR CELL STRING, SOLAR CELL MODULE, MANUFACTURING APPARATUS AND MANUFACTURING METHOD OF SOLAR CELL STRING

(71) Applicant: JINGAO SOLAR CO., LTD., Hebei (CN)

(72) Inventors: Daoyuan Chen, Jiangsu (CN); Lin Lu, Jiangsu (CN); Yuqiu Ye, Jiangsu (CN); Yanfang Zhou, Jiangsu (CN)

(73) Assignee: JINGAO SOLAR CO., LTD., Hebei (CN)

( * ) Notice: Subject to any disclaimer, the term of this patent is extended or adjusted under 35 U.S.C. 154(b) by 194 days.

(21) Appl. No.: 17/778,817

(22) PCT Filed: Sep. 30, 2020

(86) PCT No.: PCT/CN2020/119135
§ 371 (c)(1),
(2) Date: May 20, 2022

(87) PCT Pub. No.: WO2021/258576
PCT Pub. Date: Dec. 30, 2021

(65) Prior Publication Data
US 2022/0406951 A1    Dec. 22, 2022

(30) Foreign Application Priority Data

Jun. 24, 2020 (CN) .......................... 202010591389.7
Jun. 24, 2020 (CN) .......................... 202021198743.1
Jul. 15, 2020 (CN) .......................... 202010680470.2

(51) Int. Cl.
*H01L 31/05* (2014.01)
*H01L 31/18* (2006.01)

(52) U.S. Cl.
CPC ........ *H01L 31/0508* (2013.01); *H01L 31/188* (2013.01)

(58) Field of Classification Search
None
See application file for complete search history.

(56) References Cited

U.S. PATENT DOCUMENTS

2016/0163909 A1* 6/2016 Gonzalez ............ H01L 31/0201
                                                                  29/25.01
2016/0163914 A1* 6/2016 Gonzalez ................ H02S 20/25
                                                                  156/60
2018/0175233 A1* 6/2018 Reddy .................. H01L 31/028

FOREIGN PATENT DOCUMENTS

CN        109352220 A      2/2019
CN        109786492 A      5/2019
(Continued)

*Primary Examiner* — Daniel P Malley, Jr.
(74) *Attorney, Agent, or Firm* — Volpe Koenig

(57) ABSTRACT

Embodiments of the present disclosure provide a solar cell string, a solar cell module, a manufacturing apparatus and a manufacturing method thereof. The solar cell string includes at least two solar cells including first and second solar cells adjacent to each other; front and back surfaces of each of the at least two solar cells are respectively provided with a grid line, and the grid line on the front surface is connected with the grid line on the back surface by a solder strip, the first and second solar cells have an overlapping region, and the overlapping region is provided with a buffer pad covering at least one side surface of the solder strip located in the overlapping region, and the buffer pad is formed by a pad which is pre-arranged in the overlapping region and melted at high temperature.

17 Claims, 13 Drawing Sheets

(56) References Cited

FOREIGN PATENT DOCUMENTS

| | | |
|---|---|---|
| CN | 110085694 A | 8/2019 |
| CN | 110181206 A | 8/2019 |
| CN | 210123750 U | 3/2020 |
| CN | 111152037 A | 5/2020 |
| CN | 210443531 U | 5/2020 |
| CN | 111223950 A | 6/2020 |
| CN | 211028647 U | 7/2020 |
| CN | 111584684 A | 8/2020 |
| CN | 112216752 A | 1/2021 |
| DE | 202020101204 U1 | 4/2020 |

* cited by examiner

SOLAR CELL STRING, SOLAR CELL MODULE, MANUFACTURING APPARATUS AND MANUFACTURING METHOD OF SOLAR CELL STRING

The present application claims priority to the Chinese patent application No. 202010591389.7, filed Jun. 24, 2020, the Chinese patent application No. 202021198743.1, filed Jun. 24, 2020, and the Chinese patent application No. 202010680470.2, filed Jul. 15, 2020, the entire disclosure of which is incorporated herein by reference as part of the present application.

TECHNICAL FIELD

Embodiments of the present disclosure relate to a solar cell string, a solar cell module, a manufacturing apparatus and a manufacturing method of a solar cell string, and a manufacturing apparatus and a manufacturing method of a solar cell module.

BACKGROUND

With the rapid development of photovoltaic industry, the high power of photovoltaic modules is the goal pursued by the industry, and the overlapping welding technology extended from MBB series welding technology has been paid more and more attention by companies. The MBB overlapping welding technology is a technology of overlapping and welding solar cells with each other based on the current welding technology, which makes the solar cells form a solar cell string. For example, the edges of two solar cells are welded together in an overlapping manner by a solder strip, and the solder strip in the overlapping region of the two solar cells is flattened. Although this reduces the stress in the overlapping region to a certain extent, the point support of the solder strip to the solar cells still exists, which will still lead to obvious cracks in the overlapping region of the solar cells.

SUMMARY

Embodiments of the present disclosure relate to a solar cell string, a solar cell module, a manufacturing apparatus and a manufacturing method of the solar cell string, and a manufacturing apparatus and a manufacturing method of the solar cell module.

In a first aspect, an embodiment of the present disclosure provides a solar cell string, which includes at least two solar cells including a first solar cell and a second solar cell adjacent to each other, wherein a front surface and a back surface of each of the at least two solar cells are respectively provided with a grid line, and the grid line on the front surface of the first solar cell is connected with the grid line on the back surface of the second solar cell by a solder strip, the first solar cell and the second solar cell have an overlapping region, and the overlapping region is provided with a buffer pad covering at least one side surface of the solder strip located in the overlapping region, and the buffer pad is formed by a pad which is pre-arranged in the overlapping region and melted at high temperature.

For example, in the solar cell string according to the embodiment of the present disclosure, the pad is strip-shaped or band-shaped.

For example, in the solar cell string according to the embodiment of the present disclosure, the pad includes ethylene-vinyl acetate copolymer, polyolefin elastomer, composite material containing ethylene-vinyl acetate copolymer and polyolefin elastomer, or polyethylene.

In a second aspect, an embodiment of the present disclosure provides a solar cell module, the solar cell module includes the solar cell string according to any of the first aspect.

In a third aspect, an embodiment of the present disclosure provides a manufacturing apparatus of a solar cell string, which is configured to provide a buffer pad for a solar cell string to be processed, wherein the solar cell string to be processed includes at least two solar cells including a first solar cell and a second solar cell adjacent to each other, a front surface and a back surface of each of the at least two solar cells are respectively provided with a grid line, the grid line on the front surface of the first solar cell is connected with the grid line on the back surface of the second solar cell by a solder strip, and the first solar cell and the second solar cell have an overlapping region, wherein the manufacturing apparatus includes: a solar cell separating mechanism, configured to make the first solar cell and the second solar cell adjacent to each other of the solar cell string to be processed move relatively, so as to separate the first solar cell and the second solar cell in the overlapping region in a direction perpendicular to a main surface of the first solar cell, so as to lay a pad into the overlapping region.

For example, in the manufacturing apparatus of a solar cell string according to the embodiment of the present disclosure, a relative movement between the first solar cell and the second solar cell includes relative rotation and relative translation or a combination of relative rotation and relative translation.

For example, in the manufacturing apparatus of a solar cell string according to the embodiment of the present disclosure, the solar cell separating mechanism includes: a solar cell conveying device, including at least two conveying portions which are a first conveying portion and a second conveying portion adjacent to each other, wherein an included angle between a conveying surface of the first conveying portion and a conveying surface of the second conveying portion for conveying the solar cell is greater than 90 degrees and less than 180 degrees, so that the solar cell string to be processed travels from the second conveying portion to the first conveying portion along the conveying surfaces of the at least two conveying portions, and when most of the first solar cell is located on the first conveying portion but the second solar cell is not located on the first conveying portion, the first solar cell and the second solar cell in the overlapping region are relatively rotated and separated in a direction perpendicular to a main surface of the second solar cell, so as to lay the pad into the overlapping region.

For example, in the manufacturing apparatus of a solar cell string according to the embodiment of the present disclosure, the included angle between the conveying surface of the first conveying portion and the conveying surface of the second conveying portion is greater than or equal to 135 degrees and less than 180 degrees.

For example, in the manufacturing apparatus of a solar cell string according to the embodiment of the present disclosure, the included angle between the conveying surface of the first conveying portion and the conveying surface of the second conveying portion is equal to 135 degrees.

For example, in the manufacturing apparatus of a solar cell string according to the embodiment of the present disclosure, the solar cell separating mechanism includes: a solar cell moving device, configured to transfer the solar cell string to be processed for laying a pad; a solar cell pick-up device, including at least two pick-up member groups, each of the at least two pick-up member groups includes one or more pick-up members, each of the at least two pick-up member groups is configured to pick up one solar cell, and the at least two pick-up member groups are configured to drive adjacent solar cells to move, so that the first solar cell and the second solar cell in the overlapping region are far away along a third preset direction, so that the first solar cell and the second solar cell are separated in a direction perpendicular to a main surface of the first solar cell, so that a pad is laid into the overlapping region, wherein the third preset direction is perpendicular to the main surface of the first solar cell or has an included angle greater than 0 degrees and less than 90 degrees with a perpendicular direction of the main surface.

For example, in the manufacturing apparatus of a solar cell string according to the embodiment of the present disclosure, the pick-up member is a suction member, and the solar cell pick-up device and the solar cell string to be processed are capable of moving relatively.

For example, in the manufacturing apparatus of a solar cell string according to the embodiment of the present disclosure, the third preset direction has an included angle greater than 0 degrees and less than 45 degrees with the perpendicular direction of the main surface.

For example, in the manufacturing apparatus of a solar cell string according to the embodiment of the present disclosure, each of the at least two pick-up member groups picks up one solar cell and drives the solar cell to move along the third preset direction, and in a direction away from the manufacturing apparatus along the third preset direction, a moving distance of the solar cell on an upper side is greater than a moving distance of the solar cell on a lower side.

For example, in the manufacturing apparatus of a solar cell string according to the embodiment of the present disclosure, the solar cell separating mechanism includes: a displacement mechanism, a first conveying mechanism and a second conveying mechanism, wherein the displacement mechanism is used for driving the first conveying mechanism and/or the second conveying mechanism to move; during laying, the solar cell string is transferred from the second conveying mechanism to the first conveying mechanism, the solar cell string includes a first solar cell and a second solar cell adjacent to each other, a front surface and a back surface of each of the at least two solar cells are respectively provided with a grid line, and the grid line on the front surface of the first solar cell is connected with the grid line on the back surface of the second solar cell by a solder strip, the first solar cell and the second solar cell have an overlapping region; when the first solar cell is located on the first conveying mechanism and at least a portion of the second solar cell is located on the second conveying mechanism, the displacement mechanism drives the first conveying mechanism and/or the second conveying mechanism to move so as to separate the first solar cell and the second solar cell in the overlapping region in a direction perpendicular to a main surface of the first solar cell, so as to lay the pad into the overlapping region.

For example, the manufacturing apparatus of the solar cell string according to the embodiment of the present disclosure further includes: a heating mechanism, configured to heat at least a portion of the pad after the pad is laid into the overlapping region so as to melt the pad and connect the first solar cell and/or the second solar cell.

For example, in the manufacturing apparatus of a solar cell string according to the embodiment of the present disclosure, the first conveying mechanism and the second conveying mechanism include a conveyor belt, and the solar cell string is arranged on the conveyor belt, and the conveyor belt drives the solar cell string to move to convey the solar cell string.

For example, in the manufacturing apparatus of a solar cell string according to the embodiment of the present disclosure, the displacement mechanism is used for driving the first conveying mechanism to move, and the first conveying mechanism is rotatably connected with the second conveying mechanism; when the solar cell string is transferred from the second conveying mechanism to the first conveying mechanism, the first conveying mechanism and the second conveying mechanism have an included angle of a first preset angle with a horizontal plane; when the first solar cell is located on the first conveying mechanism and at least a portion of the second solar cell is located on the second conveying mechanism, the displacement mechanism converts the included angle between the first conveying mechanism and the horizontal plane into a second preset angle, so that the first solar cell and the second solar cell in the overlapping region are separated.

For example, in the manufacturing apparatus of a solar cell string according to the embodiment of the present disclosure, the first preset angle ranges from 5 degrees to 45 degrees.

For example, in the manufacturing apparatus of a solar cell string according to the embodiment of the present disclosure, the displacement mechanism is used for driving the first conveying mechanism and the second conveying mechanism to move, when the first solar cell is located on the first conveying mechanism and at least a portion of the second solar cell is located on the second conveying mechanism, the displacement mechanism makes the first conveying mechanism and the second conveying mechanism separate from each other along a first preset direction, so as to separate the first solar cell and the second solar cell in the overlapping region.

For example, in the manufacturing apparatus of a solar cell string according to the embodiment of the present disclosure, the first preset direction is perpendicular to a main surface of the first solar cell or has an included angle greater than 0 degrees and less than 90 degrees with a perpendicular direction of the main surface.

For example, the manufacturing apparatus of a solar cell string according to the embodiment of the present disclosure further includes: a pad laying mechanism, configured to lay the pad into the overlapping region when the first solar cell and the second solar cell in the overlapping region are separated; wherein the pad laying mechanism includes: a feeding mechanism configured to convey the pad in a second preset direction; a cutting mechanism for cutting off the pad when a length of the conveyed pad meets a preset requirement; and a traction mechanism used for laying the cut off pad to the overlapping region.

For example, in the manufacturing apparatus of a solar cell string according to the embodiment of the present disclosure, the first conveying mechanism and the second conveying mechanism include a suction structure, and the suction structure is used for fixing the solar cell string on the first conveying mechanism and the second conveying mechanism by suction.

For example, the manufacturing apparatus of a solar cell string according to the embodiment of the present disclosure further includes: a laminating device configured to laminate the solar cell string so that the pad melts and forms a buffer pad covering at least one side surface of the solder strip located in the overlapping region, wherein the laminating device includes: a laminating plate provided with a groove, when laminating, the laminating plate is arrange above the first solar cell and the second solar cell, and the groove is arranged above the overlapping region.

For example, in the manufacturing apparatus of a solar cell string according to the embodiment of the present disclosure, a width of the groove is larger than a width of the overlapping region, the groove includes a first end and a second end which are arranged opposite to each other, and the second solar cell is stacked above the first solar cell; when laminating, the second end is located above the first solar cell and the first end is located above the second solar cell, and a distance between the first end and the overlapping region is greater than a distance between the second end and the overlapping region.

For example, in the manufacturing apparatus of a solar cell string according to the embodiment of the present disclosure, the groove penetrates through the laminating plate.

For example, in the manufacturing apparatus of a solar cell string according to the embodiment of the present disclosure, a number of the groove is at least two, the grooves are arranged in at least two rows along a first direction, and the rows include a first row and a second row adjacent in a second direction, and a position of the groove in the first row is asymmetrical with a position of the groove in the second row, and the first direction is perpendicular to the second direction.

For example, in the manufacturing apparatus of a solar cell string according to the embodiment of the present disclosure, a width of the groove is 2 cm±1 cm.

For example, in the manufacturing apparatus of a solar cell string according to the embodiment of the present disclosure, a distance between the second end and the overlapping region is 8 mm±7 mm.

For example, in the manufacturing apparatus of a solar cell string according to the embodiment of the present disclosure, a depth of the groove is not less than 0.25 mm.

For example, in the manufacturing apparatus of a solar cell string according to the embodiment of the present disclosure, the laminating plate is made of a soft material.

For example, in the manufacturing apparatus of a solar cell string according to the embodiment of the present disclosure, the laminating plate is made of a high temperature resistant material.

For example, in the manufacturing apparatus of a solar cell string according to the embodiment of the present disclosure, the laminating device further includes: a laminating back plate for laminating, wherein the laminating plate is connected with the laminating back plate, and the laminating plate is arranged on the first solar cell and the second solar cell, and the groove of the laminating plate is located above the overlapping region; when laminating, laminating pressure is transferred from the laminating back plate to the laminating plate, and then transferred from the laminating plate to the first solar cell and the second solar cell.

For example, in the manufacturing apparatus of a solar cell string according to the embodiment of the present disclosure, the second preset direction is perpendicular to an extending direction of the solder strip.

In a fourth aspect, an embodiment of the present disclosure provides a manufacturing method of a solar cell string according to any of the first aspect, including: arranging a pad and a solder strip on a front surface of the first solar cell; overlapping a second solar cell above the first solar cell with a back surface of the second solar cell facing the front surface of the first solar cell, so that the grid line on the back surface of the second solar cell is connected to the solder strip, and the pad is located in the overlapping region of the first solar cell and the second solar cell; laminating the first solar cell and the second solar cell, the pad is melted and forms a buffer pad covering at least one side surface of the solder strip in the overlapping region, wherein arranging the pad and the solder strip on the front surface of the first solar cell includes: placing a pad on the front surface of the first solar cell; connecting the grid line on the front surface of the first solar cell to the solder strip; or connecting the grid line on the front surface of the first solar cell to the solder strip; placing a pad on the solder strip.

For example, in the manufacturing method of a solar cell string according to the embodiment of the present disclosure, laminating the first solar cell and the second solar cell includes: arranging a laminating device above the first solar cell and the second solar cell, so that laminating pressure is transmitted to the first solar cell and the second solar cell through the laminating device, and the laminating device includes a laminating plate, wherein the laminating plate is arranged with a groove, and the groove is located above the overlapping region.

In a fifth aspect, an embodiment of the present disclosure provides a manufacturing method of a solar cell string according to any of the first aspect, including: obtaining or preparing a solar cell string to be processed, wherein the solar cell string to be processed includes at least two solar cells, and the at least two solar cells include a first solar cell and a second solar cell adjacent to each other, wherein a front surface and a back surface of each of the at least two solar cells are respectively provided with a grid line, and the grid line on the front surface of the first solar cell is connected with the grid line on the back surface of the second solar cell by a solder strip, the first solar cell and the second solar cell have an overlapping region; separating the first solar cell and the second solar cell in the overlapping region; laying a pad into the overlapping region; melting the pad to form a buffer pad covering at least one side surface of the solder strip located in the overlapping region.

For example, in the manufacturing method of a solar cell string according to the embodiment of the present disclosure, melting the pad includes: laminating the first solar cell and the second solar cell, including: arranging a laminating device above the first solar cell and the second solar cell, so that laminating pressure is transmitted to the first solar cell and the second solar cell through the laminating device, and the laminating device includes a laminating plate, wherein the laminating plate is arranged with a groove, and the groove is located above the overlapping region.

In a sixth aspect, an embodiment of the present disclosure provides a manufacturing apparatus of a solar cell module, including the manufacturing apparatus of a solar cell string according to any of the third aspect.

In a seventh aspect, an embodiment of the present disclosure provides a manufacturing method of a solar cell module, including: obtaining the solar cell module by adopting the manufacturing apparatus of the solar cell module according to the sixth aspect, wherein the solar cell module includes a solar cell string, the solar cell string includes at least two solar cells, and the at least two solar cells include a first solar cell and a second solar cell adjacent to each other, wherein a front surface and a back surface of each of the at least two solar cells are respectively provided with a grid line, and the grid line on the front surface of the first solar cell is connected with the grid line on the back surface of the second solar cell by a solder strip, the first solar cell and and the second solar cell have an overlapping region, and the overlapping region is provided with a buffer pad covering at least one side surface of the solder strip located in the overlapping region, and the buffer pad is formed by a pad which is pre-arranged in the overlapping region and melted at high temperature.

BRIEF DESCRIPTION OF THE DRAWINGS

The above and/or additional aspects and advantages of the present disclosure will become apparent and readily understood from the description of embodiments taken in conjunction with the following drawings, in which.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "Upper", "lower", "left", "right", etc. are only used to indicate the relative positional relationship, and when the absolute position of the object to be described is changed, the relative positional relationship may also change accordingly.

In the present disclosure, it should be noted that unless otherwise specified and limited, the terms "installation", "connecting" and "connection" should be understood in a broad sense, for example, they can be fixed connection, detachable connection or integrated connection. It can be connected mechanically or electrically. It can be directly connected, indirectly connected through an intermediate medium, or communicated inside two elements. For those of ordinary skilled in the field, the specific meanings of the above terms in the present invention can be understood in specific situations.

Figure 1:
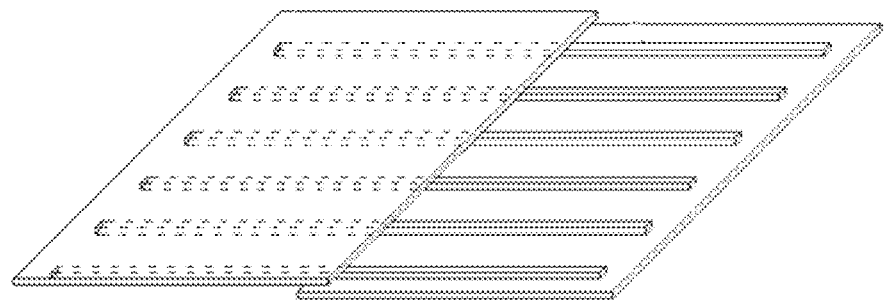
FIG. 1 is a schematic structural diagram of a solar cell string.

In the overlapping welding technology used to produce photovoltaic modules, as illustrated in FIG. 1, by flattening the solder strip in the overlapping region of two solar cells, the point support stress of the solder strip on the solar cell in the overlapping region can be reduced, and the risk of cracking of the solar cell can be reduced. However, in this scheme, the point support of the solder strip on the solar cells still exists, which may lead to obvious crack in the overlapping region of the solar cell.

Embodiments of the present disclosure provide a solar cell string, the solar cell string includes at least two solar cells, the at least two solar cells include a first solar cell and a second solar cell adjacent to each other, wherein a front surface and a back surface of each of the at least two solar cells are respectively provided with a grid line, and the grid line on the front surface of the first solar cell is connected with the grid line on the back surface of the second solar cell by a solder strip, the first solar cell and the second solar cell have an overlapping region, and the overlapping region is provided with a buffer pad covering at least one side surface of the solder strip located in the overlapping region, and the buffer pad is formed by a pad which is pre-arranged in the overlapping region and melted at high temperature. By arranging the buffer pad covering the solder strip located in the overlapping region in the overlapping region of adjacent solar cells, and the buffer pad is formed by a pad which is pre-arranged in the overlapping region and melted at high temperature, so that the contact between the solar cells is changed from point contact through the solder strip to surface contact through the buffer pad, and the solar cells are prevented from cracking because of contact stress caused by point contact between the solder strip and two solar cells, and the structure is simple and easy to process. Furthermore, in the embodiment of the present disclosure, the buffer pad is formed by a pad which is pre-arranged in the overlapping region before laminating and melted by laminating, so that the generation efficiency of the buffer pad is improved, and an additional heating process is not needed, which is convenient for processing.

Furthermore, it is difficult for an exemplary series welding apparatus to add a pad to two solar cells during the processing of series welding laminated solar cells, and it difficult to reform the apparatus. Moreover, even if the process of laying the pad is added to the exemplary series welding apparatus, it may affect the manufacturing accuracy of solar cell string of the series welding apparatus, and it is prone to false welding, welding deviation and so on.

The embodiments of the present disclosure further provide a manufacturing apparatus of a solar cell string, the apparatus includes: a displacement mechanism, a first conveying mechanism and a second conveying mechanism, the displacement mechanism is used for driving the first conveying mechanism and/or the second conveying mechanism to displace; during laying, the solar cell string is transferred from the second conveying mechanism to the first conveying mechanism, and the solar cell string includes a first solar cell and a second solar cell adjacent to each other, the first solar cell and the second solar cell are connected by a solder strip, and the first solar cell and the second solar cell have an overlapping region; when the first solar cell is located on the first conveying mechanism and at least a portion of the second solar cell is located on the second conveying mechanism, the displacement mechanism drives the first conveying mechanism and/or the second conveying mechanism to move so as to separate the first solar cell and the second solar cell in the overlapping region, so as to lay a pad into the overlapping region, thus realizing that a pad is added to the two solar cells in the processing process of series welding laminated solar cells, so as to avoid crack of the solar cells in the laminating progress caused by contact stress generated by point contact between the solder strip and two solar cells, and the structure of this apparatus is simple and easy to process.

The following is a detailed description of a solar cell string, a solar cell module, a manufacturing apparatus and a manufacturing method of the solar cell string and a manufacturing apparatus and a manufacturing method of the solar cell module according to the embodiments of the present disclosure.

Figure 2:
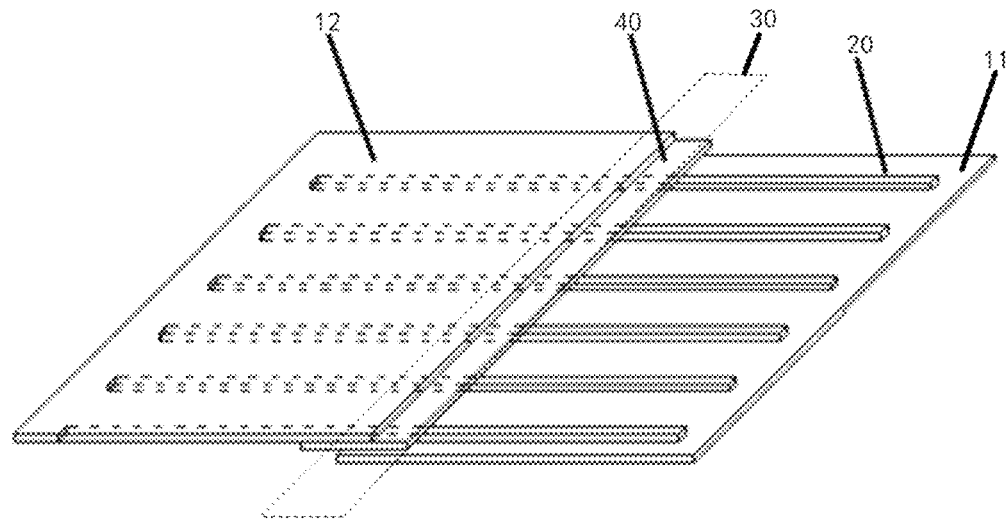
FIG. 2 is a schematic structural diagram of a solar cell string according to an embodiment of the present disclosure.

As illustrated in FIG. 2, a solar cell string proposed by an embodiment of the present disclosure, for example, a photovoltaic solar cell string, includes at least two solar cells, a front surface and a back surface of each of the at least two solar cells are respectively provided with a grid line, and the at least two solar cells include a first solar cell 11 and a second solar cell 12 adjacent to each other, and the grid line on the front surface of the solar cell 11 and the grid line on the back surface of the solar cell 12 are connected by a plurality of solder strips 20. There is an overlapping region 30 between the solar cell 11 and the solar cell 12, and a buffer pad 40 is arranged in the overlapping region 30, the buffer pad 40 covers the solder strip 20 located in the overlapping region 30, and the buffer pad is formed by a pad which is pre-arranged in the overlapping region and melted at high temperature. In this structure, because the buffer pad 40 covers at least one side surface of the solder strip in the overlapping region, the solder strip 20 does not directly contact with at least one of the front surface of the solar cell 11 and the back surface of the solar cell 12 in the overlapping region 30, and the solar cell 11 and the solar cell 12 are in surface contact through the buffer pad 40, thus avoiding the risk of crack of the solar cells caused by the contact stress of the point contact between the solar cells and the solder strip 20 in the overlapping region 30.

For example, in the figure, the structure of the solar cell string is illustrated by taking the first solar cell 11 and the second solar cell 12 as examples, and it should be clear to those skilled in the art that the above structure is also applicable to any two adjacent solar cells in the solar cell string, and will not be described in detail here.

For example, the buffer pad 40 is formed by a pad 61 that is melted after laminating. The pad 61 is made of non-conductive soft material, including ethylene-vinyl acetate copolymer, polyolefin elastomer, composite material containing ethylene-vinyl acetate copolymer and polyolefin elastomer, or elastomer material such as polyethylene.

For example, widths of the pad 61 and the buffer pad 40 are not less than a width of the overlapping region 30. For example, the width of the buffer pad 40 is 5 mm±3 mm.

For example, the number of solder strips 20 is not less than two, and lengths of the pad 61 and the buffer pad 40 are not less than a spacing between two solder strips 20 which are farthest from each other among the solder strips 20, so that the buffer pad can cover all solder strips located in the overlapping region 30.

After laminated by laminating machine, the pad 61 will melt and deform because of the high temperature of laminating process, and the melted pad 61 will wrap the solder strip 20 in the overlapping region 30, so that the solder strip 20 in the overlapping region 30 will not directly contact with the solar cell 11 and the solar cell 12 at the same time, and the original point contact between the solar cell 11 and the solar cell 12 will be changed into the elastic surface contact formed by the pad, thus reducing the risk of crack of the solar cells.

For example, the length of the overlapping region 30 is similar to the lengths of the first solar cell 11 and the second solar cell 12, and the width is 0.7 mm±0.5 mm.

Embodiments of the present disclosure further provide a solar cell module including any of the solar cell strings described above, and the solar cell module also includes other connectors for electrically connecting the solar cell strings, etc., which are not limited by the embodiments of the present disclosure.

Figure 3:
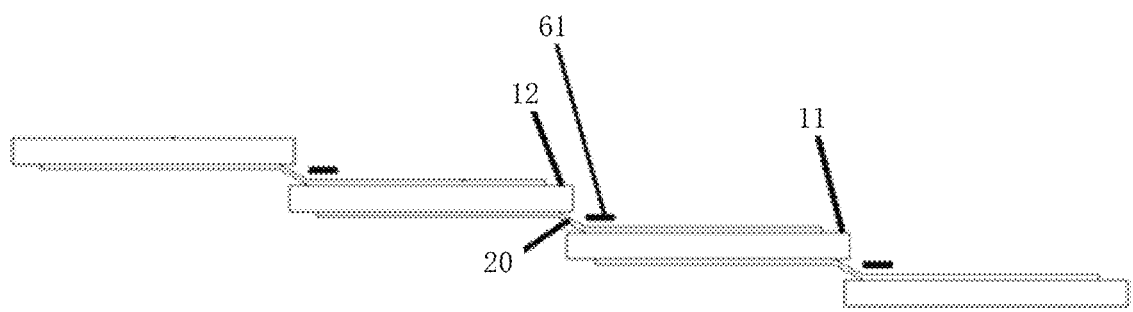
FIG. 3 is a schematic structural diagram of a solar cell string when laying a pad according to an embodiment of the present disclosure.
Figure 4:
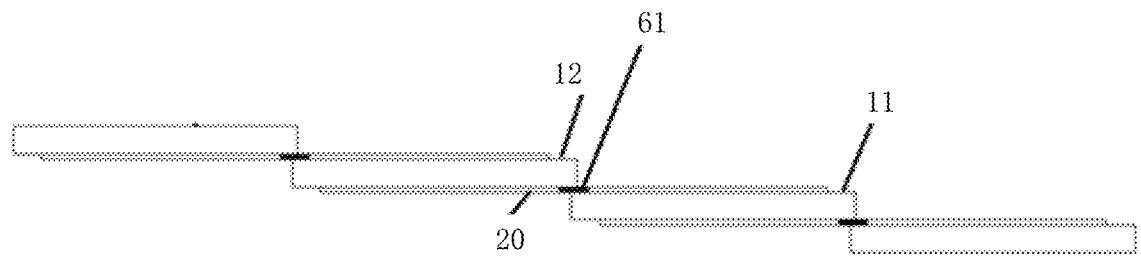
FIG. 4 is a structural schematic diagram of a solar cell string after a pad is laid according to an embodiment of the present disclosure.

In order to lay the pad 61 in the overlapping region 30, the embodiment of the present disclosure further provides a manufacturing apparatus of the solar cell string as described in any of the above embodiments, through the manufacturing apparatus of the solar cell string the pad 61 may be laid in the overlapping region 30 between the solar cells. The state when laying the pad 61 may be seen in FIG. 3, and the solar cell string reset after laying the pad may be seen in FIG. 4.

For example, the manufacturing apparatus of the solar cell string is configured to provide a buffer pad to the solar cell string to be processed, the solar cell string to be processed includes at least two solar cells, the at least two solar cells include a first solar cell and a second solar cell adjacent to each other, and a front surface and a back surface of each of the at least two solar cells are respectively provided with a grid line, and the grid line on the front surface of the first solar cell is connected with the grid line on the back surface of the second solar cell by a solder strip, the first solar cell and the second solar cell have an overlapping region.

The manufacturing apparatus includes:

A solar cell separating mechanism, configured to make the first solar cell and the second solar cell adjacent to each other of the solar cell string to be processed move relatively, so as to separate the first solar cell and the second solar cell in the overlapping region in a direction perpendicular to a main surface of the first solar cell, so as to lay a pad into the overlapping region.

For example, the relative movement between the first solar cell and the second solar cell includes relative rotation, relative translation or a combination of relative rotation and relative translation, as long as the relative movement can separate the two solar cells in the overlapping region to leave enough space for laying pads and will not adversely affect the solder strip to pull the solder point of the solar cell, for example, relative movements that do not cause the solder point to fall off or the solar cells to break are all possible.

Here, the solar cell string to be processed refers to that the solar cells have been connected with the solder strip and the adjacent solar cells are connected by the solder strip. Next, it is necessary to lay a pad in the overlapping region of two adjacent solar cells and melt the pad to form a buffer pad.

Figure 5:
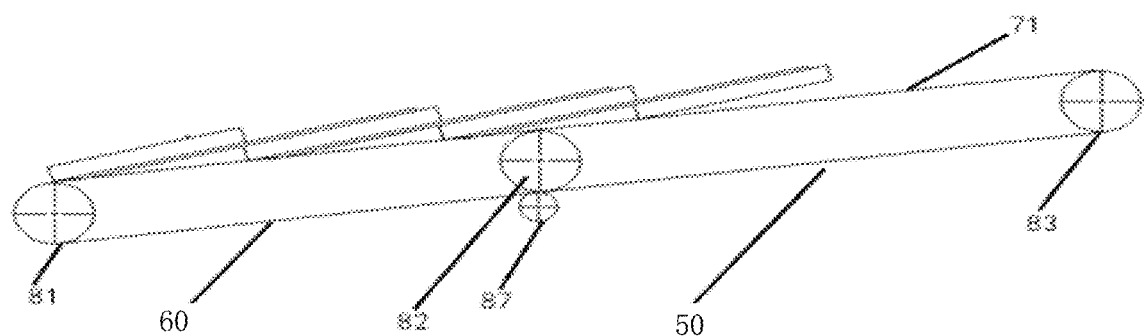
FIG. 5 is a schematic diagram of feeding a pad of an embodiment of the manufacturing apparatus according to an embodiment of the present disclosure.

For example, as illustrated in FIG. 5, the solar cell separating mechanism according to the embodiment of the present disclosure includes a first conveying mechanism 50, a second conveying mechanism 60 and a displacement mechanism.

The displacement mechanism is used to drive the first conveying mechanism 50 and/or the second conveying mechanism 60 to displace, and may drive the first conveying mechanism 50 and/or the second conveying mechanism 60 to rotate or move the position of the first conveying mechanism 50 and/or the second conveying mechanism 60.

The displacement mechanism may include any mechanical structure or circuit that can realize the above functions, which is not limited by the present disclosure.

The first conveying mechanism 50 and the second conveying mechanism 60 may have the same or different structures.

In one embodiment, the displacement mechanism may rotate the first conveying mechanism 50 to lay the pad 61 in the overlapping region 30. As illustrated in FIG. 5, the first conveying mechanism 50 and the second conveying mechanism 60 may include a complete conveyor belt 71, a conveying wheel 81, a conveying wheel 82 and a conveying wheel 83. The first conveying mechanism 50 includes the conveying wheel 83 and a portion of the conveyor belt on a right side of the conveying wheel 82 in FIG. 5, and the second conveying mechanism 60 includes the conveying wheel 81 and a portion of the conveyor belt on a left side of the conveying wheel 82 in FIG. 5.

Figure 6:
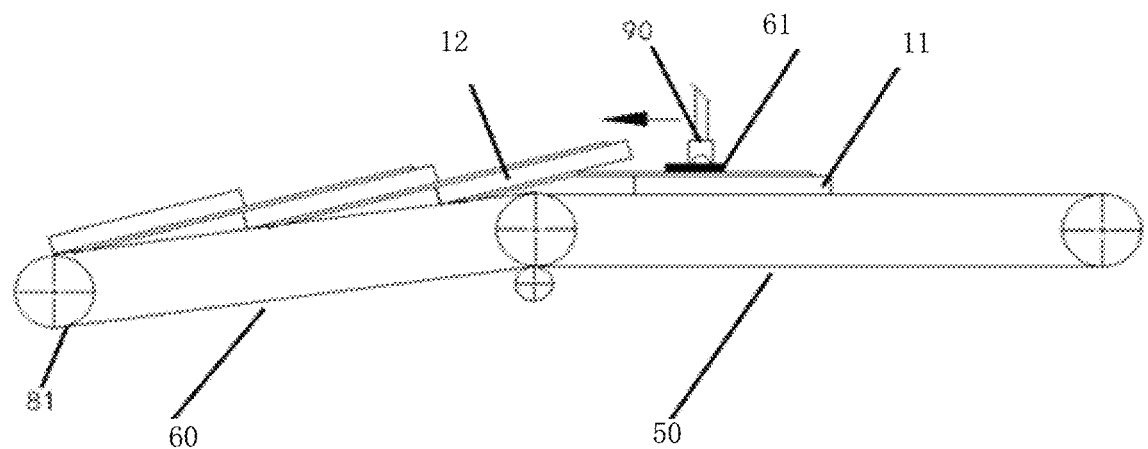
FIG. 6 is a schematic diagram of laying a pad of an embodiment of the manufacturing apparatus according to an embodiment of the present disclosure.

As illustrated in FIG. 5, when laying pad is started, the included angle between the first conveying mechanism 50 and the second conveying mechanism 60 and the horizontal plane is a first preset angle. The first solar cell 11 and the second solar cell 12 are fed to the second conveying mechanism 60 from above the conveying wheel 81. As illustrated in FIG. 6, when the first solar cell 11 is located on the first conveying mechanism 50 and at least a portion of the second solar cell 12 is located on the second conveying mechanism 60, the displacement mechanism makes the included angle between the first conveying mechanism 50 and the horizontal plane be a second preset angle, so that the first solar cell 11 and the second solar cell 12 in the overlapping region 30 are separated, and the pad laying mechanism 90 lays the pad 61 in the overlapping region 30.

For example, the first solar cell 11 and the second solar cell 12 in the overlapping region 30 are separated in a direction perpendicular to a main surface of the first solar cell 11, the main surface of the first solar cell is a surface on which the solder strip is provided.

For example, a supporting structure 87 may be arranged below the conveying wheel 82, which may be used as a rotating fulcrum during the first conveying mechanism 50 being rotated to the second preset angle with the horizontal plane, and may also support the conveyor belt when the first conveying mechanism 50 rotates to the second preset angle with the horizontal plane, so as to prevent the conveyor belt from sagging.

For example, the first preset angle ranges from 5 degrees to 45 degrees, and the second preset angle is 0 degrees.

Figure 7:
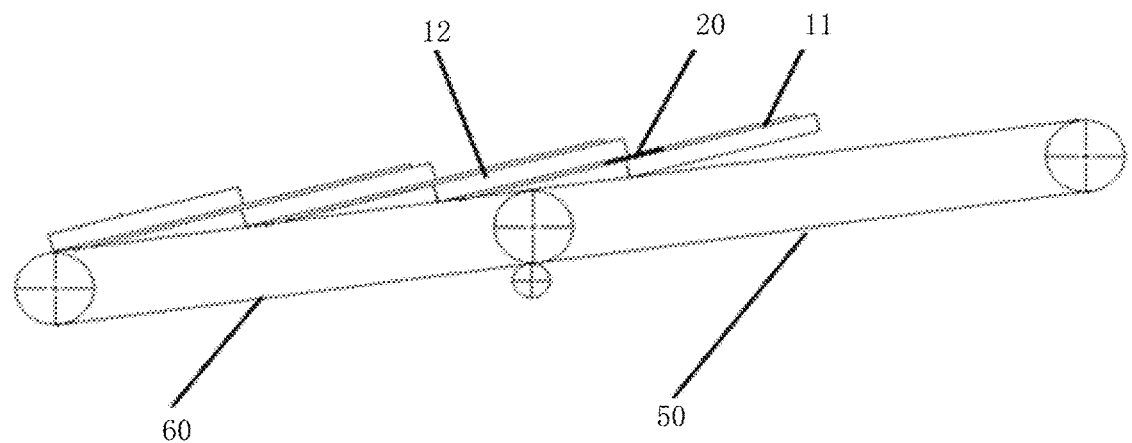
FIG. 7 is a schematic diagram of resetting after laying of an embodiment of the manufacturing apparatus according to an embodiment of the present disclosure.

After a pad 61 is laid, as illustrated in FIG. 7, the first conveying mechanism 50 may be reset to the initial position, so as to continue laying the pad in the overlapping region of the second solar cell 12 and a subsequent solar cell.

When pads are laid in all overlapping regions, the solar cell string may be laminated.

Figure 8:
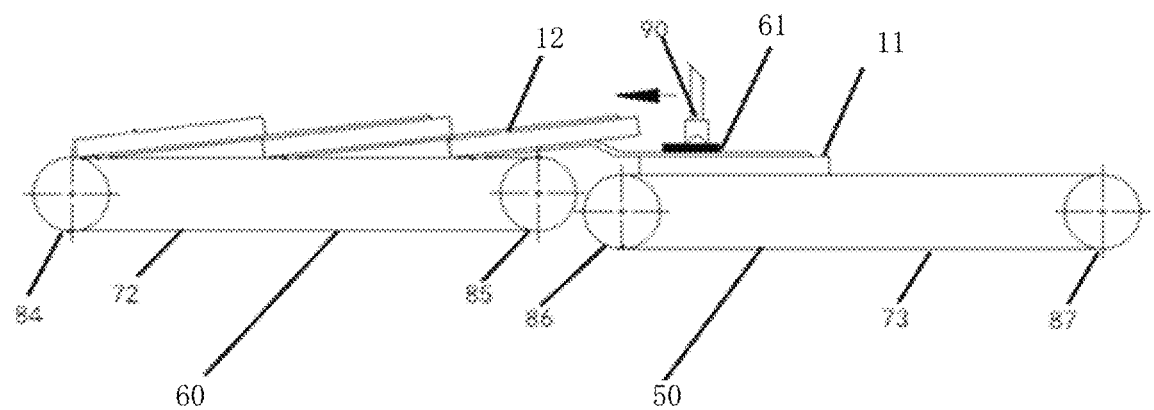
FIG. 8 is a schematic diagram of laying a pad of another embodiment of the manufacturing apparatus according to an embodiment of the present disclosure.

In another embodiment, the displacement mechanism may move the first conveying mechanism 50 up and down to lay the pad 61 in the overlapping region 30. As illustrated in FIG. 8, the first conveying mechanism 50 includes a conveyor belt 73, a conveying wheel 86 and a conveying wheel 87. The second conveying mechanism 60 includes a conveyor belt 72, a conveying wheel 84 and a conveying wheel 85. The displacement mechanism may drive the first conveying mechanism and/or the second conveying mechanism to move up and down in a vertical direction of FIG. 8, that is, in a direction perpendicular to the main surface of the solar cell. At the beginning, the first conveying mechanism 50 and the second conveying mechanism 60 are parallel to the horizontal plane, and the first conveying mechanism 50 communicates with the second conveying mechanism 60. The first solar cell 11 and the second solar cell 12 are fed from the direction of the conveying wheel 84 to the second conveying mechanism 60, and then conveyed to the direction of the first conveying mechanism 50.

As illustrated in FIG. 8, when the first solar cell 11 is located on the first conveying mechanism 50 and at least a portion of the second solar cell 12 is located on the second conveying mechanism 60, the displacement mechanism moves the first conveying mechanism 50 downward by a preset distance to make the first solar cell 11 and the second solar cell 12 in the overlapping region separate from each other, and the pad laying mechanism 90 lays the pad 61 in the overlapping region 30.

Alternatively, when the first solar cell 11 is located on the first conveying mechanism 50 and at least a portion of the second solar cell 12 is located on the second conveying mechanism 60, the displacement mechanism moves the second conveying mechanism 60 upward by a preset distance, so that the first solar cell 11 and the second solar cell 12 in the overlapping region are separated, and the pad laying mechanism 90 lays the pad 61 in the overlapping region 30.

Or, when the first solar cell 11 is located on the first conveying mechanism 50 and at least a portion of the second solar cell 12 is located on the second conveying mechanism 60, the displacement mechanism moves the second conveying mechanism 60 upward by a preset distance and moves the first conveying mechanism 50 downward by a preset distance, so that the first solar cell 11 and the second solar cell 12 in the overlapping region are separated, and the pad laying mechanism 90 lays the pad 61 into the overlapping region 30.

For example, the displacement mechanism may also move the first conveying mechanism 50 by a preset distance, so as to separate the first solar cell 11 and the second solar cell 12 in the overlapping region.

For example, the value range of the preset distance is 1-5 mm.

after a pad 61 is laid, the first conveying mechanism 50 may be reset to the initial position, so as to continue laying the pad in the overlapping region of the first solar cell 11 and a subsequent solar cell.

After pads are laid in all overlapping regions, the solar cell strings may be laminated.

Alternatively, the first conveying mechanism and the second conveying mechanism may further include a suction structure for fixing the solar cell string on the first conveying mechanism and the second conveying mechanism by suction.

Figure 9:
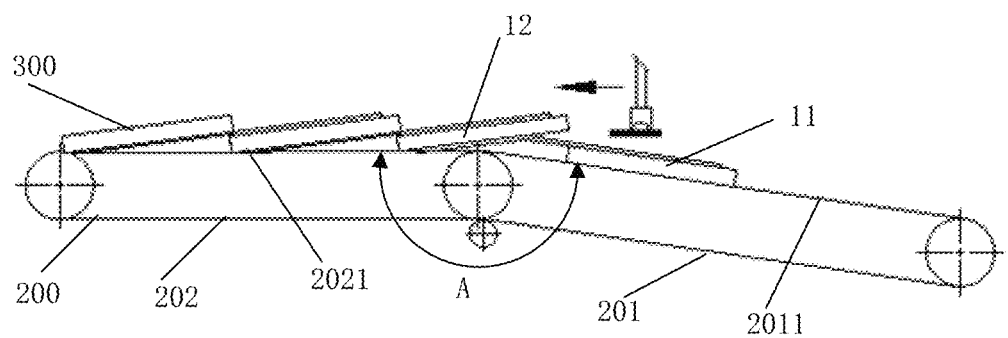
FIG. 9 is a schematic diagram of an exemplary solar cell separating mechanism according to an embodiment of the present disclosure.

Alternatively, as illustrated in FIG. 9, the solar cell separating mechanism may include a solar cell conveying device 200 including at least two conveying portions, a first conveying portion 201 and a second conveying portion 202 adjacent to each other. An included angle A between a conveying surface 2011 of the first conveying portion 201 for conveying the solar cell and a conveying surface 2021 of the second conveying portion 202 for conveying the solar cell is greater than 90 degrees and less than 180 degrees, so that the solar cell string 300 to be processed travels from the second conveying portion 202 to the first conveying portion 201 along the conveying surfaces of the at least two conveying portions, and when most of the first solar cell 11 is located on the first conveying portion 201, most of the second solar cell 12 is located on the second conveying portion 202 and the second solar cell 12 is not located on the first conveying portion 201, the first solar cell 11 and the second solar cell 12 in the overlapping region rotate relatively because of the included angle between the two conveying surfaces, so as to be separated in the direction perpendicular to the main surface of the second solar cell 12, so as to lay the pad into the overlapping region.

For example, the included angle between the conveying surface of the first conveying portion and the conveying surface of the second conveying portion is greater than or equal to 135 degrees and less than 180 degrees.

For example, the included angle between the conveying surface of the first conveying portion and the conveying surface of the second conveying portion is equal to 135 degrees.

For example, the first conveying portion 201 is arranged in a downstream direction of the second conveying portion 202, the second conveying portion 202 may be arranged horizontally, and the first conveying portion 201 may have an included angle of less than or equal to 90 degrees and greater than 0 degrees, for example, less than or equal to 45 degrees and greater than 0 degrees, with respect to the horizontal direction. For example, the conveying surface 2021 of the second conveying portion 202 is horizontally arranged, and the conveying surface 2011 of the first conveying portion 201 has an included angle greater than or equal to 90 degrees and less than 0 degrees, for example, less than or equal to 45 degrees and greater than 0 degrees, with respect to the horizontal direction.

For example, a conveyor belt may be supported on the conveying surfaces of the two conveying portions, and the conveyor belt is driven by a driving device to drive the solar cell string to move, and a suction device may be arranged on the conveyor belt to fix the solar cell string on the conveyor belt. When the conveyor belt brings the first solar cell to a junction of the first conveying portion and the second conveying portion, because the first conveying portion is inclined, the conveyor belt also inclines downward, and a front end of the first solar cell may be suspended at a certain moment without the support of the conveyor belt. When further driven by the conveyor belt, because of the action of gravity, the first solar cell will fall on the first conveying portion which is inclined at downstream, that is, the conveyor belt on the first conveying portion. At this time, most of the second solar cell adjacent to it in the upstream direction is still located on the horizontally arranged second conveying portion, and no any portion is located on the first conveying portion, so that the first solar cell inclines while the second solar cell remains horizontal, and the two solar cells are separated in the overlapping region. At this time, the conveyor belt may be stopped, and thus the solar cells also stops moving, and further, the pad laying operation may be carried out by using a manipulator, a hand, etc. Next, after the pad is laid, the conveyor belt continues to drive the solar cell string to move, when the second solar cell also falls on the first conveying portion, the pad laying work between the second solar cell and the adjacent solar cell behind it may be carried out.

For example, if the conveyor belt does not stop moving and the manipulator still has enough time to lay the pad, the conveyor belt may not stop in order to improve the working efficiency.

For example, the solar cell conveying device 200 illustrated in FIG. 9 further includes several transmission wheels, which does not constitute a limitation to the present application. Those skilled in the art may make changes according to their needs, as long as it can realize the solution that the conveying surfaces of the first conveying portion 201 and the second conveying portion 202 have an included angle and can drive the solar cell string to move.

The solar cell conveying device provided here does not need to be provided with a mechanism for causing the two conveying portions to move relatively, and utilizes the included angle formed after the two conveying portions are installed, so that when the solar cells move on the conveying surfaces of the conveying portions, two adjacent solar cells can be separated in the overlapping region because of the included angle, thus having a simple structure, needing no additional moving structure and time, further improving the working efficiency and saving the cost.

Alternatively, as illustrated in FIGS. 10(a) and 10(b), the solar cell separating mechanism may further include: a solar cell moving device 400 configured to transfer the solar cell string 300 to be processed for pad laying; a solar cell pick-up device 500 including at least two pick-up member groups, each of the at least two pick-up member groups includes one or more pick-up members 501, each of the at least two pick-up member groups is configured to pick up one solar cell, and the at least two pick-up member groups are configured to drive adjacent solar cells to move, so that the first solar cell and the second solar cell in the overlapping region are far away along a third preset direction, so that the first solar cell and the second solar cell are separated in a direction perpendicular to the main surface of the first solar cell, so that the pad is laid in the overlapping region. The third preset direction is perpendicular to the main surface of the first solar cell or has an included angle greater than 0 degrees and less than 90 degrees with the perpendicular direction of the main surface. As illustrated in FIG. 11, a direction indicated by an arrow B is the perpendicular direction of the main surface.

Figure 10:
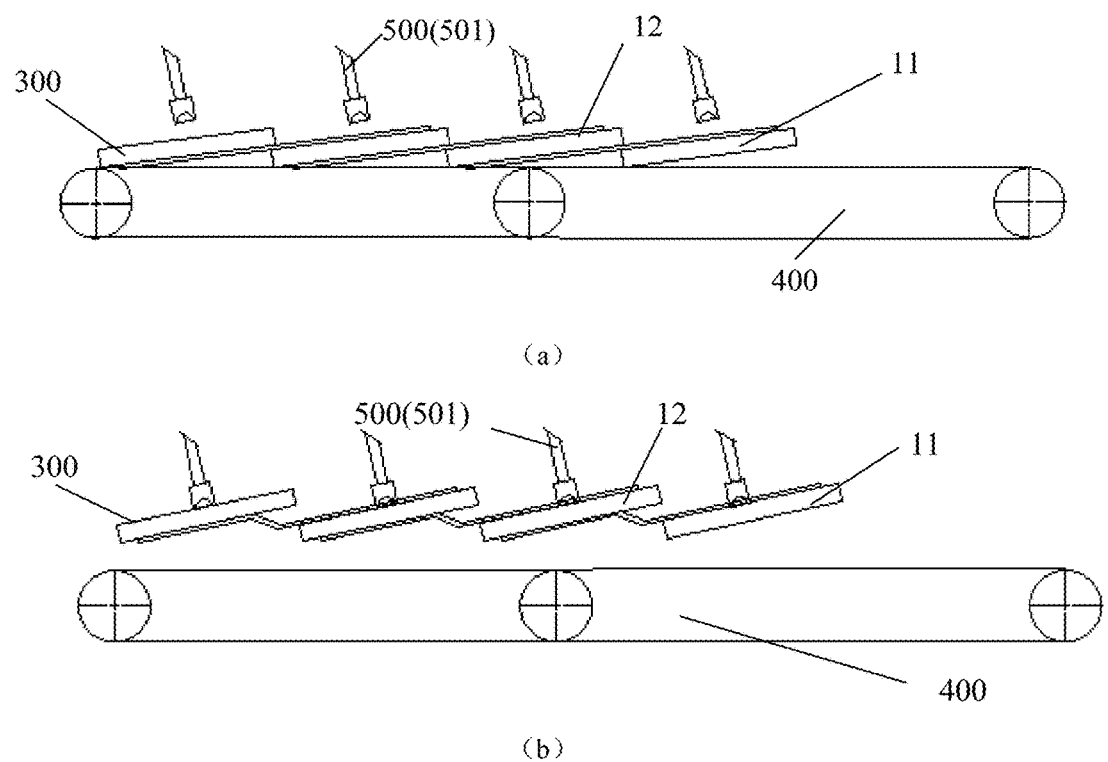
FIG. 10 is a schematic diagram of another exemplary solar cell separating mechanism according to an embodiment of the present disclosure.
Figure 11:
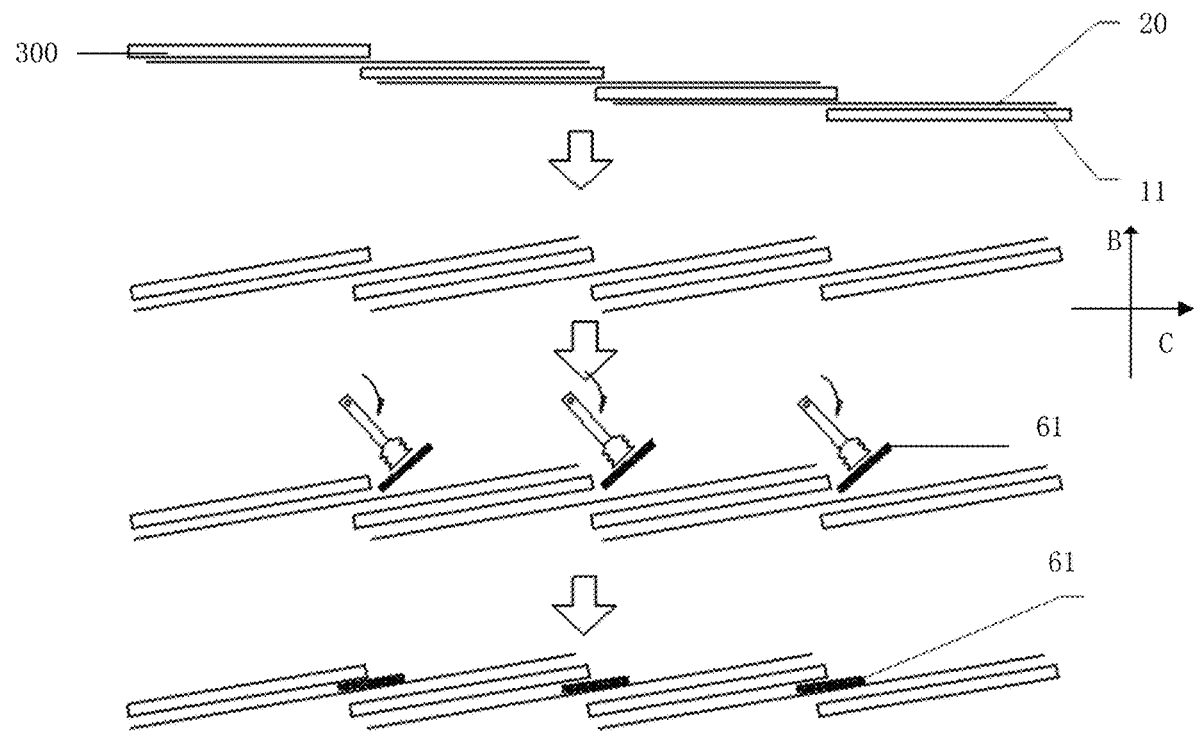
FIG. 11 is a schematic diagram of an exemplary pad laying process according to an embodiment of the present disclosure.

Here, it should be noted that FIG. 10(a) illustrates a state when the solar cell pick-up device does not pick up the solar cell, and the solar cell illustrated in the figure does not seem to be laid flatwise on the solar cell moving device, but in the actual process, the solar cell is very thin, and because there is an overlapping region between adjacent solar cells, except the solar cell located at a bottom layer, other solar cells are slightly inclined because they are underlaid by the solar cell at the bottom layer. However, because the solar cell is very thin, such inclination may be negligible, in this case, it may be approximately considered that the solar cell is arranged flatwise on the solar cell moving device, while the solar cells in FIG. 10(a) and FIG. 10(b) are illustrated to be thick, so this inclination is exaggerated. In practice, this inclination is negligible, and it is considered that the main surfaces of the solar cells are all arranged parallel to the conveying surface of the solar cell moving device. This situation is applicable to all embodiments of the present disclosure, and FIG. 10 is taken as an example for explanation here, and other embodiments will not be specifically explained. As illustrated in FIG. 11, the arrow B illustrates the perpendicular direction of the main surface and the arrow C illustrates an extending direction of the main surface.

FIG. 10(b) illustrates a state when the solar cells are picked up by the solar cell pick-up device. As illustrated in the figure, the adjacent solar cells are separated in the overlapping region by the pick-up device, so that the pad laying operation can be performed.

For example, the pick-up member is a suction member 501, and the solar cell pick-up device 500 and the solar cell string 300 to be processed can move relatively.

For example, when the solar cell pick-up device includes at least four pick-up member groups, four solar cells can be picked up every time, and after the adjacent solar cells in three overlapping regions are separated, the pad may be laid in the overlapping regions. FIG. 11 illustrates an exemplary operation flow chart, which illustrates a laying process of the pad from top to bottom along the arrow. The first picture illustrates an initial state of the solar cell string to be processed, and the solder strip has been connected to the solar cells, and there is an overlapping region between the adjacent solar cells. In the second picture, the adjacent solar cells are separated in a third preset direction under the action of the solar cell pick-up device, thus providing a space for laying the pad. In the third picture, the pad laying mechanism uses a tool such as a manipulator to lay the pad 61 in the overlapping region of adjacent solar cells. In the fourth picture, the solar cell laid with the pad is driven by the solar cell pick-up device to reset to the initial position. Then, the pad laying operation of the following four solar cells may be carried out. At this time, it may be that the solar cell moving device drives the solar cell string to move to an operating position of the following four solar cells at the solar cell pick-up device, or it may be that the solar cell pick-up device is moved to pick up the following four solar cells and lay pads on the following four solar cells.

For example, the solar cell pick-up device may also include pick-up member groups whose number is the same with the number of solar cells in the solar cell string to be processed, so that all the solar cells may be picked up at one time, and a laying operation of all pads may be completed without moving the solar cell string or the solar cell pick-up device, saving time and improving efficiency.

For example, the third preset direction may have an included angle greater than 0 degrees and less than 90 degrees with the perpendicular direction B of the main surface.

Here, when the included angle between the third preset direction and the perpendicular direction of the main surface is greater than 0 degrees and less than 90 degrees, for example, greater than 0 degrees and less than 45 degrees, the relative movement of two adjacent solar cells may be a combination of rotation and translation, so as to prevent defects such as dropping of a solder point of the solar cell and the fragmentation of the solar cell.

For example, each of the at least two pick-up member groups picks up a solar cell and drives the solar cell to move along the third preset direction. In a direction away from the manufacturing apparatus along the third preset direction, a moving distance of the solar cell on an upper side is greater than a moving distance of the solar cell on a lower side, so that adjacent solar cells are separated.

For example, in the direction away from the manufacturing apparatus along the third preset direction, it may be that the solar cell at the lower side does not move, but the solar cell at the upper side moves, etc. The present application does not limit this, as long as the adjacent solar cells can be separated in the overlapping region.

For example, at least two solar cell pick-up groups included in the solar cell pick-up device may be arranged in one same structure together, but they are controlled by different control devices and move independently of each other; or may be arranged in different structures independently of each other, independently controlled and independently moved.

For example, the manufacturing apparatus may further include a heating mechanism configured to heat at least a portion of the pad after the pad is laid in the overlapping region so as to melt the pad and connect the first solar cell and/or the second solar cell.

Figure 12:
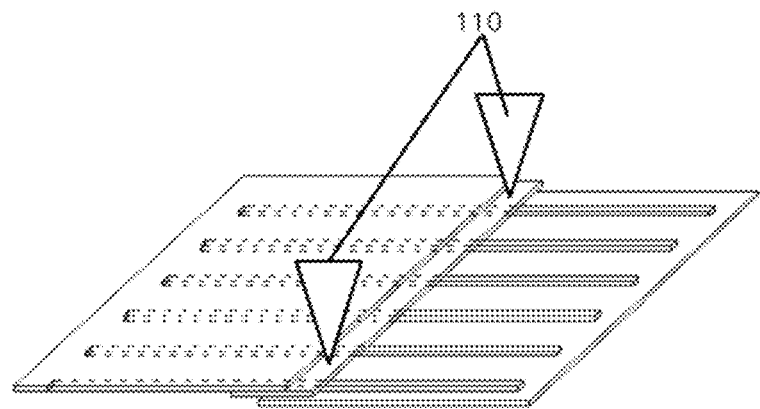
FIG. 12 is a schematic diagram of pad preheating according to an embodiment of the present disclosure.

For example, FIG. 12 illustrates the heating mechanism 110. In order to prevent the pad from slipping during a subsequent solar cell string movement or processing, after the pad is added to the overlapping region of the solar cell string, the pad may be heated locally by using the heating mechanism 110, so that the pad is locally melted and bonded with the solar cell, that is, the pad is pre-fixed to the solar cell. As illustrated in FIG. 12, for example, the heating mechanism 110 may preheat two ends and a center position of the pad, so that it is partially melted and connected with the first solar cell 11 and/or the second solar cell 12, thus preventing the pad from being displaced in the subsequent processing or moving process.

For example, the two ends and the central position of a portion of the pad located above the lower solar cell among the two solar cells with an overlapping region may be preheated, so that the pad is partially melted and connected with the lower solar cell, so as to prevent the portion of the pad located below the upper solar cell from being melted during local heating, resulting in the melted pad sticking to the conveying mechanism.

For example, the heating mechanism may include heating devices such as a soldering horn, infrared laser or hot air and the like.

For example, the manufacturing apparatus may further include a pad laying mechanism configured to lay the pad into the overlapping region when the first solar cell and the second solar cell in the overlapping region are separated; the pad laying mechanism includes: a feeding mechanism configured to convey the pad along a second preset direction; a cutting mechanism for cutting off the pad when a length of the conveyed pad meets a preset requirement; and a traction mechanism used for laying the cut off pad to the overlapping region.

Figure 13:
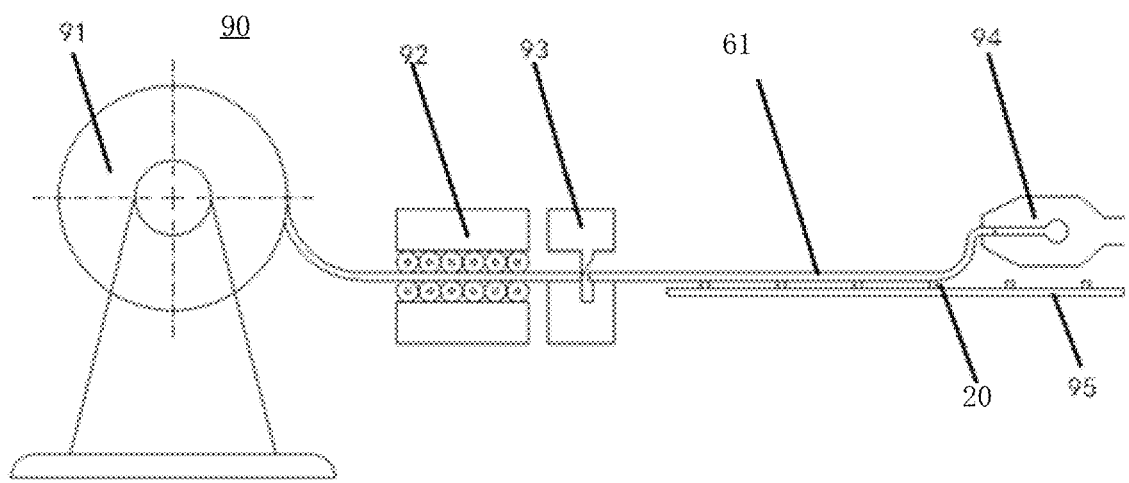
FIG. 13 is a structural schematic diagram of a pad laying mechanism according to an embodiment of the present disclosure.

For example, as illustrated in FIG. 13, the pad laying mechanism 90 may include a feeding tray 91, a feeding roller 92, a cutting knife 93 and a pulling jaw 94. FIG. 13 illustrates the process of laying a pad by using this mechanism after the solder strip is laid on the solar cell in advance, and the process includes:

Cutting the pad 61 to a preset width and hung in the feeding tray 91;

Adjusting a feeding direction of the pad 61 of the laying mechanism to be perpendicular to a feeding direction of the solder strip 20;

The feeding roller 92 drives the pad 61 to move towards the solar cell 95;

When a length of the pad 61 reaches the preset length, the cutting knife 93 cuts off the pad 61, and the pulling jaw 94 pulls the cut pad 61 to the preset position on the solar cell 95.

For example, it may also be that using this mechanism to lay the pad 61 on the solar cell 11 first, and then lay the solder strip 20 on the pad 61, which is not limited in this embodiment.

For example, other mechanical structures may be used to realize the pad laying, for example, a mechanical arm with a suction nozzle is used to suck up the pad, and then the pad is placed at a preset position on the solar cell, which is not limited in the present application.

For example, the second preset direction is the feeding direction of the pad 61, perpendicular to an extending direction of the solder strip 20, that is, perpendicular to the feeding direction of the solder strip 20.

For example, the manufacturing apparatus may further include a laminating device configured to laminate the solar cell string so that the pad melts and forms a buffer pad covering at least one side surface of the solder strip located in the overlapping region. The laminating device includes a laminating plate provided with a groove, when laminating, the laminating plate is arranged above the first solar cell and the second solar cell, and the groove is arranged above the overlapping region.

After laying the pad 61, the solar cell string may be put into the laminating device for laminating. In the lamination process, the pad 61 will melt because of the laminating temperature and pressure. For example, the pad 61 can flow in a direction toward the lower solar cell among the two overlapped solar cells with the help of the laminating plate 100 illustrated in FIG. 14, so as to form a buffer pad covering the solder strip located in the overlapping region.

Figure 15:
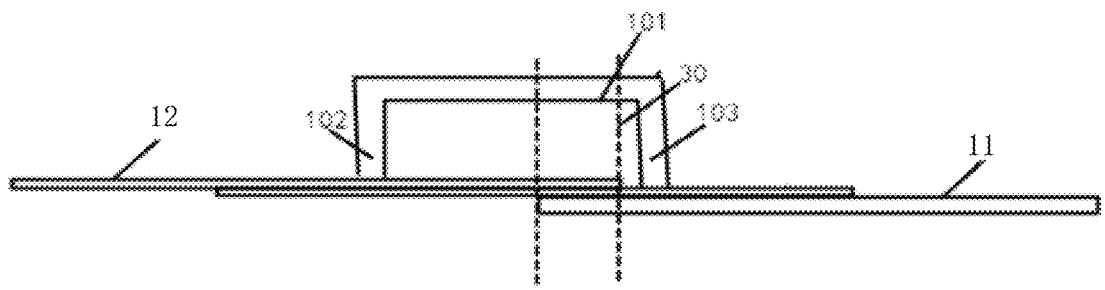
FIG. 15 is a front view when the laminating plate is arranged above the solar cell string according to an embodiment of the present disclosure.

As illustrated in FIG. 15, the laminating device proposed in the present application includes a laminating plate 100 provided with a groove 101. The laminating device is used to transmit the laminating pressure generated by a laminating machine to the first solar cell 11 and the second solar cell 12, and there is an overlapping region 30 between the solar cells. As illustrated in the figure, when laminating, the laminating plate is arranged on the first solar cell 11 and the second solar cell 12, and the groove 101 is located above the overlapping region 30.

Further, in the lamination process, the upper solar cell of the two overlapped solar cells is suspended, so it is easy to break or crack. Therefore, in order to further buffer the pressure applied to the upper solar cell, the groove 101 may be closer to the upper second solar cell 12 compared with the lower first solar cell 11, so as to support the upper second solar cell 12. FIG. 15 is a front view when the laminating plate 100 is arranged above the first solar cell 11 and the second solar cell 12, the groove 101 includes a first end 102 and a second end 103 which are oppositely arranged. As illustrated in FIG. 15, the second solar cell 12 is stacked above the first solar cell 11, and the first end 102 of the groove 101 is located above the second solar cell 12 and the second end 103 is located above the first solar cell 11. The distance between the first end 102 and the overlapping region 30 is greater than the distance between the second end 103 and the overlapping region 30.

Furthermore, when a pad easily melted is arranged between the overlapping region 30 of the first solar cell 11 and the second solar cell 12, by arranging the groove 101 closer to a position of the second solar cell 12, it can help the pad melted because of the heat and pressure of laminating to cover the overlapping region 30 and flow towards the second solar cell 12, so as to further reduce the risk of crack or break during the laminating process of the solar cells.

A length of the groove 101 should not be less than lengths of the solar cell 11 and the solar cell 12, and a width of the groove 101 is not less than a width of the overlapping region 30 to ensure that the groove can cover the overlapping region. For example, the width of the groove 101 is 2 cm±1cm.

Figure 16:
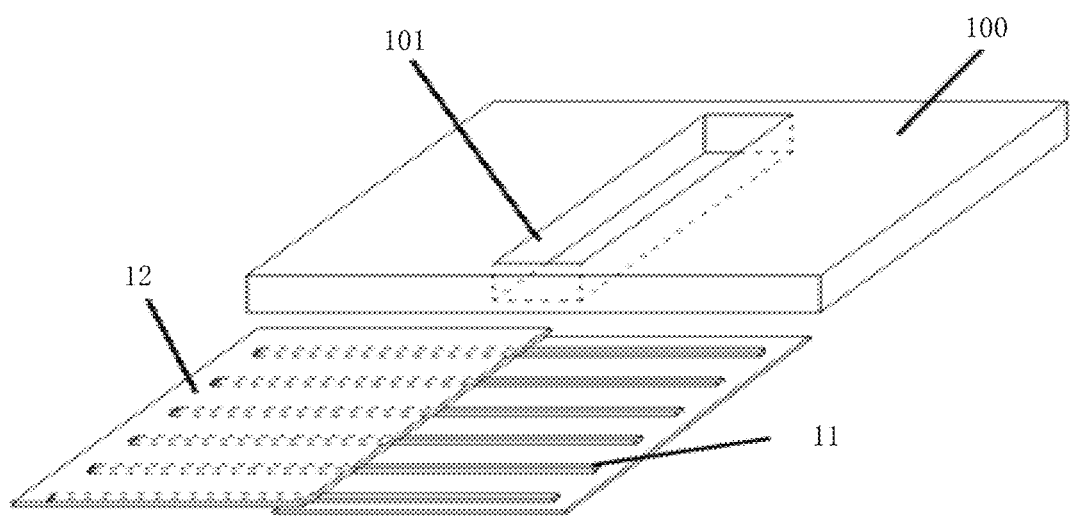
FIG. 16 is a structural schematic diagram of a laminating plate with a through groove and a component to be laminated according to an embodiment of the present disclosure.

Furthermore, because the processing precision of opening the groove 101 in the laminating plate 100 during the manufacturing process of the laminating plate 100 is difficult to be controlled and the processing is difficult, a thickness of the laminating plate 100 may be set to 0.5 mm±0.3 mm. As illustrated in FIG. 16, a groove 101 penetrating through the laminating plate 100 is opened in the laminating plate so that a depth of the groove 101 is the same as the thickness of the laminating plate.

For example, a distance between the second end and the overlapping region is 8 mm±7 mm. For example, the depth of the groove 101 is not less than a thickness of the overlapping region 30 of the solar cell 11 and the solar cell 12.

For example, the depth of the groove is not less than 0.25 mm.

In order to buffer the pressure of the laminating device on the solar cell 11 and the solar cell 12, the laminating plate 100 may be made of a soft material. For example, the soft materials include silica gel, rubber, nylon, polyester resin and polyethylene terephthalate (PET). In some embodiments, the laminating plate 100 may also be made of lightweight metal materials including aluminum. In some embodiments, the laminating plate 100 may also be made of a combination of metal and soft material, such as connecting a rubber plate to an aluminum plate, opening a groove 101 in the rubber plate, and fixing the aluminum plate to a laminating machine.

In order to ensure that the laminating plate 100 can withstand the laminating temperature of the laminating machine, the laminating plate 100 may be made of high temperature resistant material.

Figure 17:
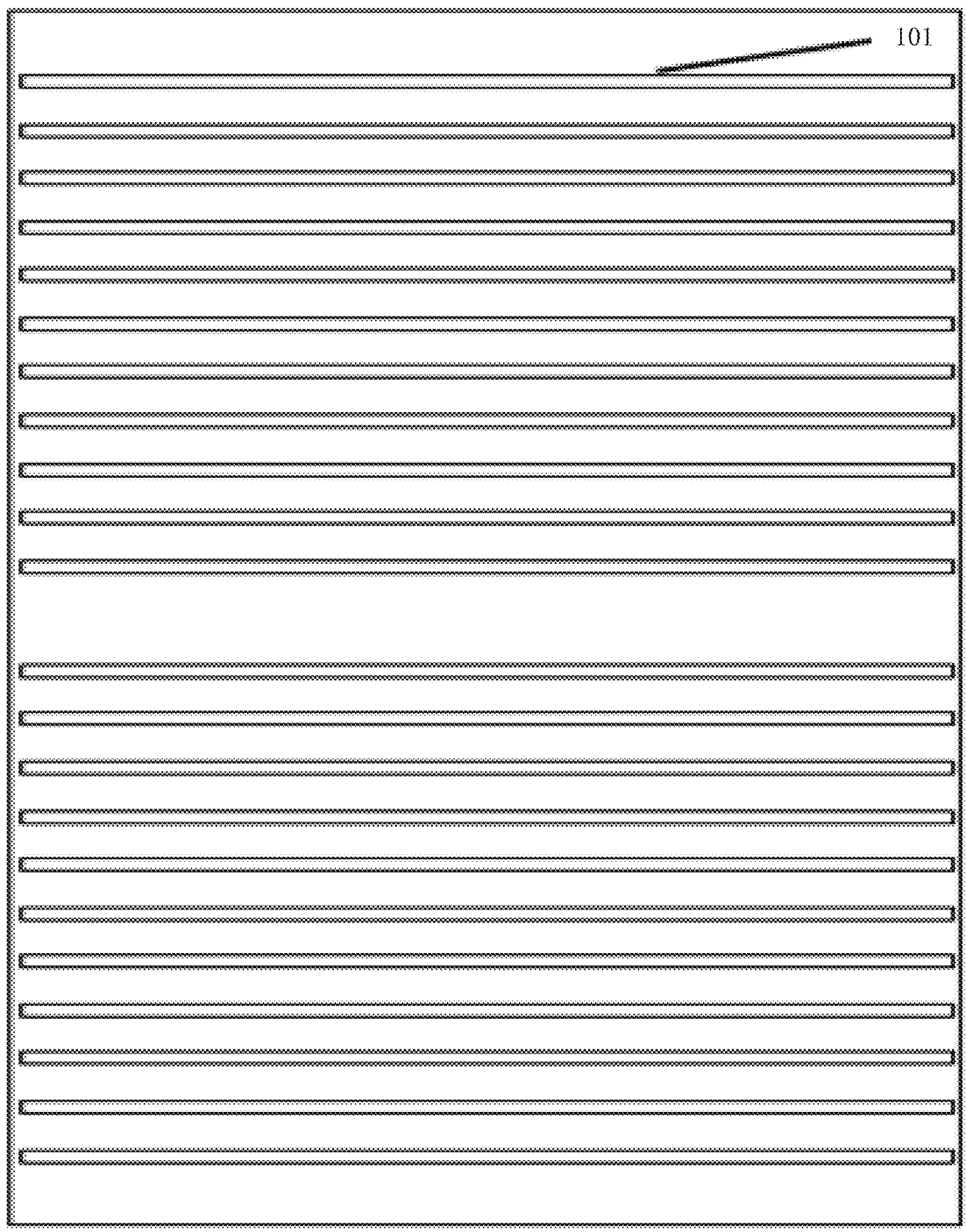
FIG. 17 is a schematic structural diagram of a laminating plate according to an embodiment of the present disclosure.
Figure 18:
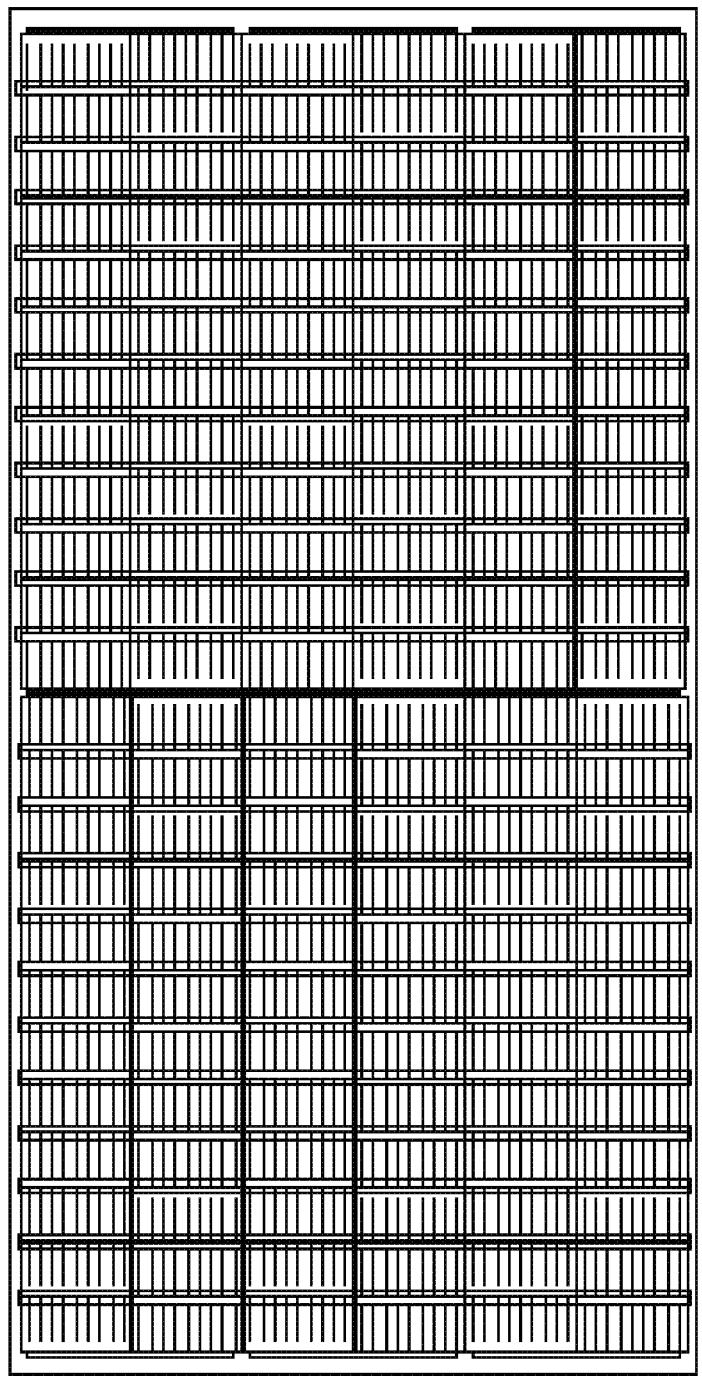
FIG. 18 is a top view when the laminating plate illustrated in FIG. 17 is arranged above the solar cell according to an embodiment of the present disclosure.
Figure 19:
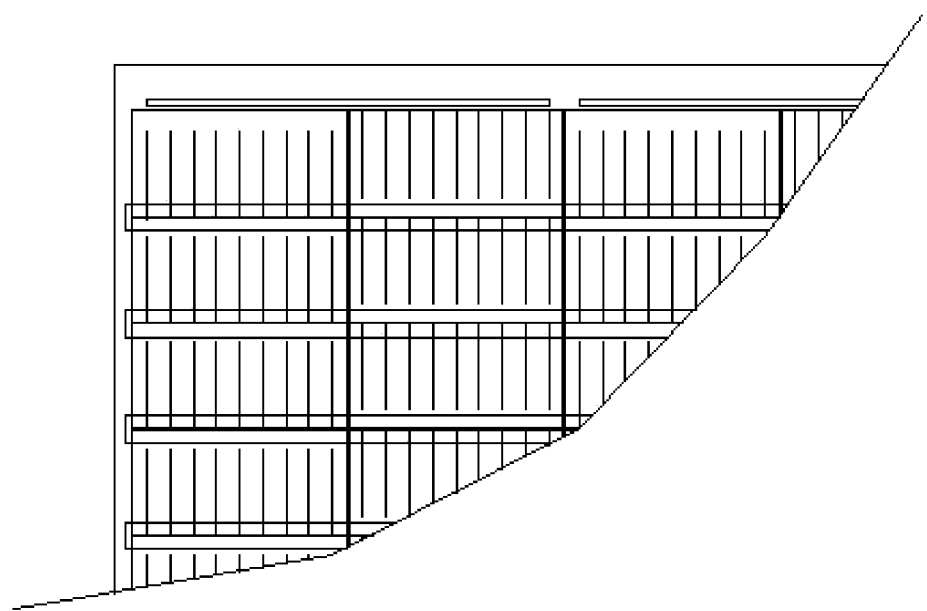
FIG. 19 is a partial enlarged view of the laminating plate and the solar cell illustrated in FIG. 18 according to an embodiment of the present disclosure.

As illustrated in FIG. 17, in order to improve the laminating efficiency of a photovoltaic module, a plurality of grooves 101 may be formed in the laminating plate to laminate a plurality of solar cells at the same time. When laminating, the solar cell may be arranged under the laminating plate in a structure as illustrated in FIG. 18. As illustrated in FIG. 18, in a up and down direction of FIG. 18, there is an overlapping region between two adjacent solar cells. In this embodiment, the groove 101 is symmetrical, that is, as illustrated in FIG. 19, when laminating, an opposite ends of the groove 101 are respectively located above the two overlapped solar cells, and a distance between one end and the overlapping region and the distance between the other end and the overlapping region are equal. When laminating, the groove 101 covers a top of each overlapping region, so as to buffer the pressure applied to the solar cell and avoid the solar cell from cracking or breaking because of the pressure applied by the laminating machine.

Figure 20:
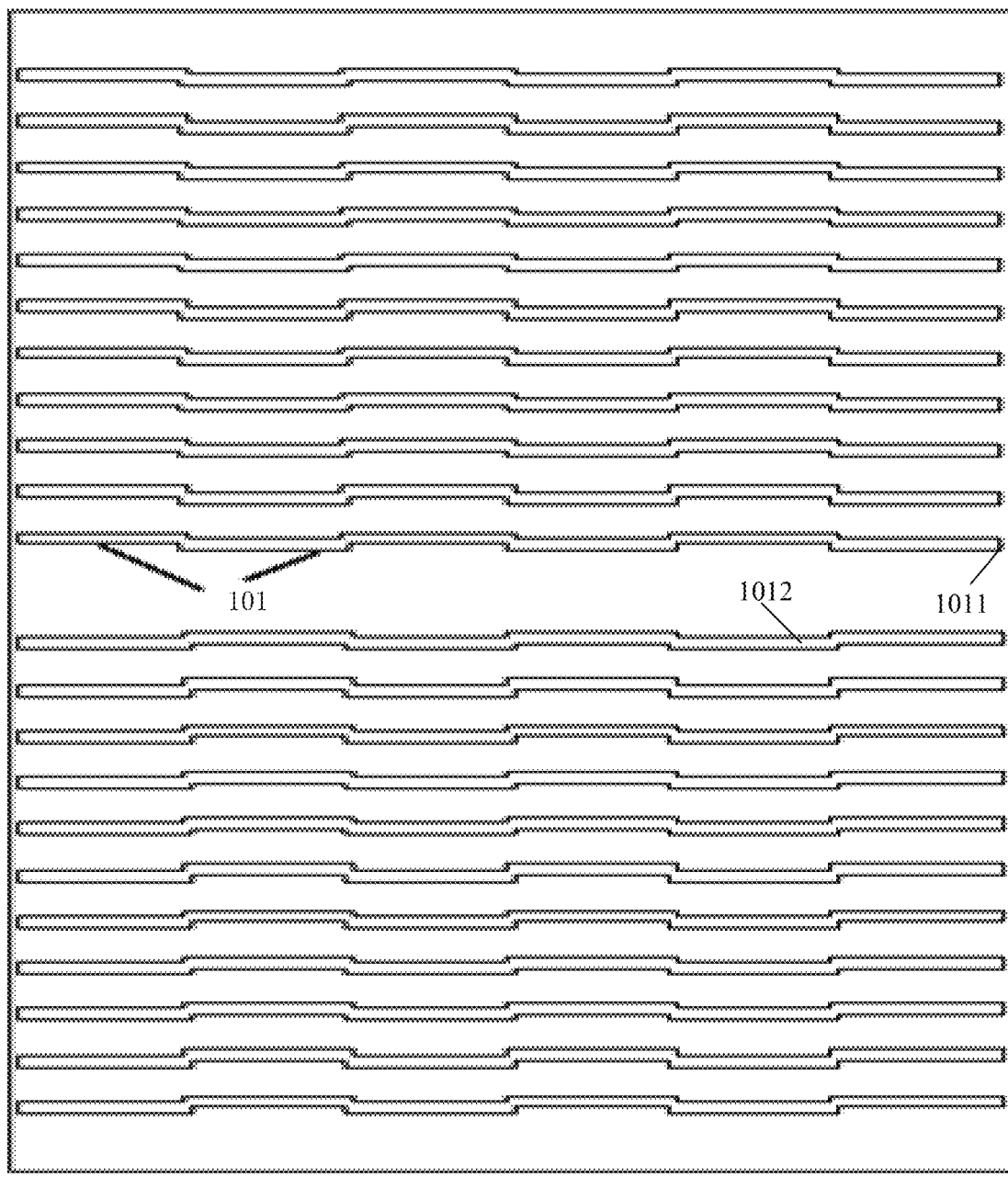
FIG. 20 is a schematic structural diagram of a laminating plate according to an embodiment of the present disclosure.
Figure 21:
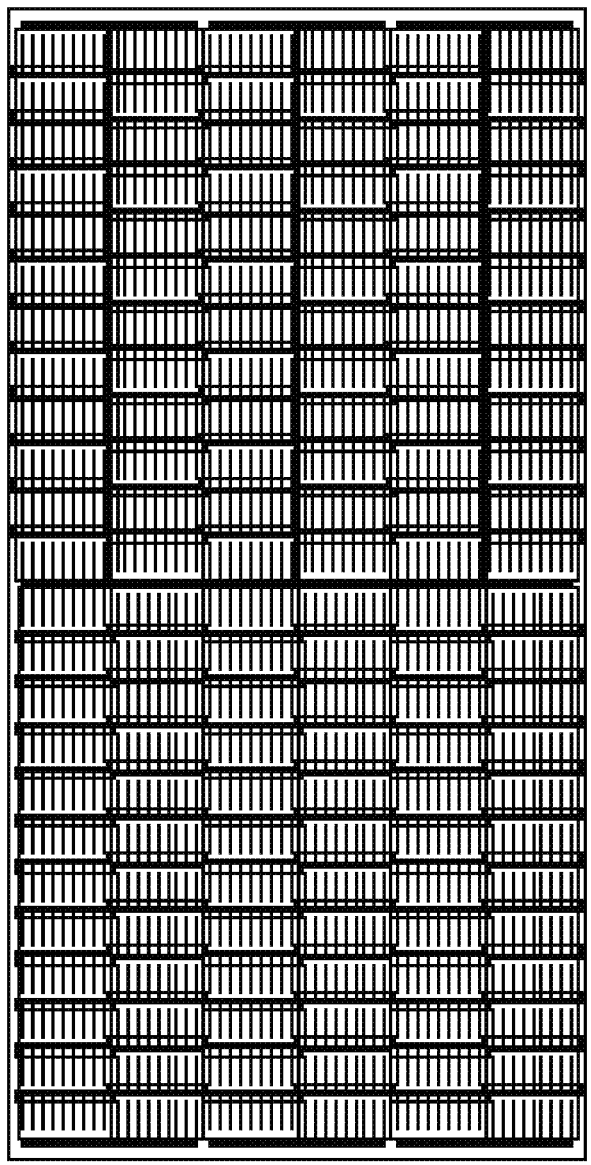
FIG. 21 is a top view when the laminating plate illustrated in FIG. 20 is arranged above the solar cell according to an embodiment of the present disclosure.
Figure 22:
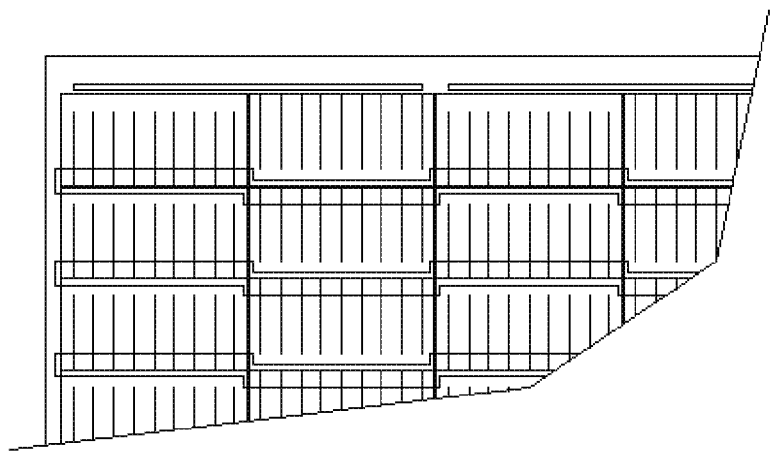
FIG. 22 is a partial enlarged view of the laminating plate and the solar cell illustrated in FIG. 21 according to an embodiment of the present disclosure.

In order to further buffer the pressure exerted by the laminating machine on the upper solar cell among the overlapped solar cells, a plurality of grooves 101 whose positions are asymmetric may be formed in the laminating plate. As illustrated in FIG. 20, a plurality of grooves 101 with asymmetric positions are formed in the laminating plate, and each groove 101 has a first end and a second end opposite to each other. When laminating, the solar cells are arranged such that there is an overlapping region between two adjacent solar cells in the up and down direction as illustrated by 101, and are arranged in a plurality of columns in the up and down directions as illustrated in FIGS. 21 and 22, and a laminating device as illustrated in FIG. 20 is arranged above the solar cells. The plurality of columns include a first column and a second column adjacent in a lateral direction of FIGS. 21 and 22. In the first column, the upper solar cell is stacked above the lower solar cell in the up and down direction of FIGS. 21 and 22, and in the second column, the lower solar cell is stacked above the upper solar cell in the up and down direction of FIGS. 21 and 22. In order to adapt to the arrangement manner of solar cells, as illustrated in FIG. 20, the laminating plate is provided with grooves 101 corresponding to each overlapping region. The grooves 101 are arranged in at least two columns along the first direction, and the columns include a first column 1011 and a second column 1012 adjacent to each other in the second direction. Positions of the grooves 101 in the first column 1011 are asymmetrical with positions of the grooves 101 in the second column 1012, and the first direction is perpendicular to the second direction.

The laminating plate 100 is provided with a groove whose width is not less than the width of the overlapping region 30. During laminating, the laminating plate 100 is placed on the solar cell string and the groove is aligned with the overlapping region 30 of the solar cell string. The pressure exerted by the laminating device is transmitted to the solar cell string through the laminating plate, and the laminating plate buffers the pressure exerted by the laminating device, thus preventing portions of the two solar cells located in the overlapping region from being cracked or broken because of directly bearing the pressure exerted by the laminating device.

For example, the laminating device may further include a laminating back plate for laminating, the laminating plate is connected with the laminating back plate, and the laminating plate is arranged on the first solar cell and the second solar cell, and the groove of the laminating plate is located above the overlapping region; when laminating, laminating pressure is transferred from the laminating back plate to the laminating plate, and then transferred from the laminating plate to the first solar cell and the second solar cell.

Embodiments of the present disclosure further provide a manufacturing apparatus of a solar cell module for manufacturing the solar cell module as described in any of the above embodiments, the manufacturing apparatus of a solar cell module includes the manufacturing apparatus of the solar cell string as described in any of the above embodiments.

Embodiments of the present disclosure further provide a manufacturing method of a solar cell string as described above, including:

Arranging a pad and a solder strip on a front surface of the first solar cell;

Overlapping a second solar cell above the first solar cell with a back surface of the second solar cell facing the front surface of the first solar cell, so that the grid line on the back surface of the second solar cell is connected to the solder strip, and the pad is located in the overlapping region of the first solar cell and the second solar cell;

Laminating the first solar cell and the second solar cell, the pad is melted and forms a buffer pad covering at least one side surface of the solder strip in the overlapping region.

The arranging the pad and the solder strip on the front surface of the first solar cell includes:

Placing a pad on the front surface of the first solar cell;

Connecting the grid line on the front surface of the first solar cell to the solder strip; or Connecting the grid line on the front surface of the first solar cell to the solder strip; and Placing a pad on the solder strip.

For example, laminating the first solar cell and the second solar cell includes: setting a laminating device above the first solar cell and the second solar cell, so that laminating pressure is transmitted to the first solar cell and the second solar cell via the laminating device, and the laminating device includes a laminating plate with a groove above the overlapping region.

Figure 23:
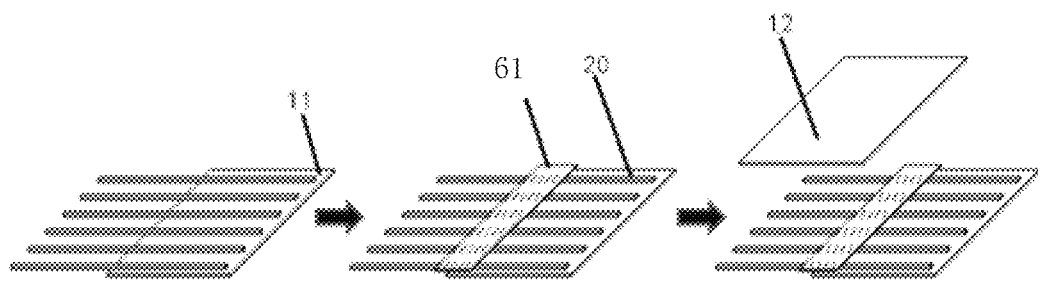
FIG. 23 is a schematic diagram of a manufacturing process of a photovoltaic solar cell string according to an embodiment of the present disclosure.

For example, as illustrated in FIG. 23, in the production process of the solar cell string, the solder strip 20 may be connected to the upper surface of the solar cell 11 in advance, then the pad 61 is placed at a preset position, and finally the solar cell 12 is placed on the pad 61, and make the solar cell 11 parallel to the solar cell 12 and a width of the overlapping region between the solar cell 11 and the solar cell 12 is set to a preset width. After setting the solar cell 12, the solar cell string may be placed in a laminating machine for lamination.

Figure 14:
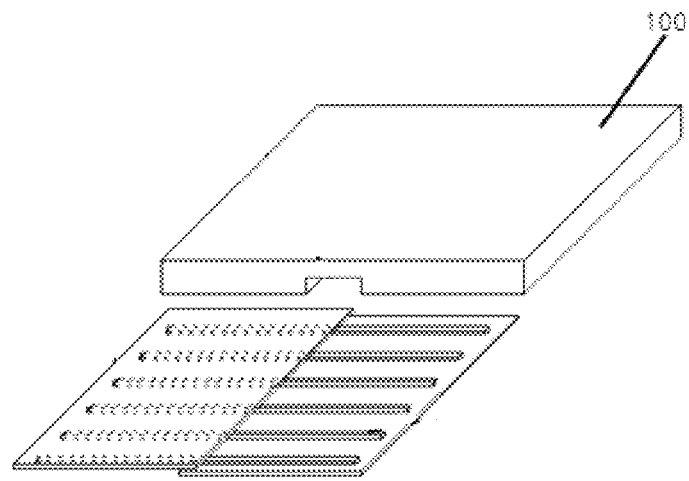
FIG. 14 is a schematic structural diagram of a laminating plate according to an embodiment of the present disclosure.

In the laminating process, the pad 61 will melt because of the laminating temperature and pressure. For example, with the help of the laminating plate 100 as illustrated in FIG. 14, the pad 61 can flow along a direction toward the lower solar cell among the two overlapped solar cells, forming a buffer pad covering the solder strip in the overlapping region.

For example, a length of the overlapping region 30 is similar to lengths of the solar cell 11 and the solar cell 12, and a width is 0.7 mm±0.5 mm.

Figure 24:
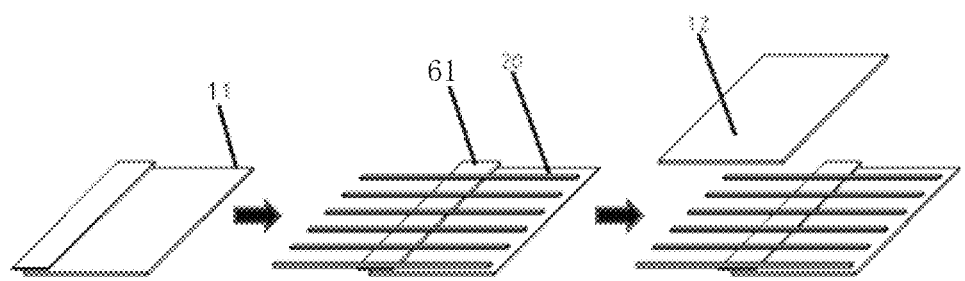
FIG. 24 is another schematic diagram of a manufacturing process of a solar cell string according to an embodiment of the present disclosure.

For example, as illustrated in FIG. 24, in the production process of the solar cell string, a pad 61 may be arranged on the upper surface of the solar cell 11 in advance, and then a solder strip 20 may be arranged on the pad 61, and finally the solar cell 12 may be placed above the solar cell 11, so that edges of the solar cell 11 and the solar cell 12 have an overlapping region 30. After the setting of the solar cell 12 is completed, the solar cell string may be placed in a laminating machine for laminating. During laminating, the pad 61 will melt because of the laminating temperature and pressure, thus forming a buffer pad 40 covering the solder strip 20 in the overlapping region 30.

Embodiments of the present disclosure further provide an exemplary manufacturing method of a solar cell string as described above, including:

Obtaining or preparing a solar cell string to be processed, wherein the solar cell string to be processed includes at least two solar cells, and the at least two solar cells include a first solar cell and a second solar cell adjacent to each other, wherein a front surface and a back surface of each of the at least two solar cells are respectively provided with a grid line, and the grid line on the front surface of the first solar cell is connected with the grid line on the back surface of the second solar cell by a solder strip, the first solar cell and the second solar cell have an overlapping region;

Separating the first solar cell and the second solar cell in the overlapping region;

Laying a pad into the overlapping region;

Melting the pad, to form a buffer pad covering at least one side surface of the solder strip located in the overlapping region.

For example, the melting the pad includes: laminating the first solar cell and the second solar cell, including: arranging a laminating device above the first solar cell and the second solar cell, so that laminating pressure is transmitted to the first solar cell and the second solar cell via the laminating device, and the laminating device includes a laminating plate with a groove above the overlapping region.

For example, the pad may be melted by any of the methods described above, for example, heating by a solder horn, infrared laser or hot air, etc. The embodiments of the present disclosure are not limited to this, and different melting methods may be adopted according to different pad materials.

After the solar cell string have been formed a string by providing a solder strip, the adjacent solar cells in the overlapping region are separated, the pad is laid and melted so that the pad forms a buffer pad covering at least one side surface of the solder strip in the overlapping region, which can further save the process time, further improve the efficiency and improve the product quality.

The embodiments of the present disclosure further provide a manufacturing method of a solar cell module, which includes: obtaining the solar cell module by adopting the manufacturing apparatus of the solar cell module according to any of the above, wherein the solar cell module includes a solar cell string, the solar cell string includes at least two solar cells, and the at least two solar cells include a first solar cell and a second solar cell adjacent to each other, wherein a front surface and a back surface of each of the at least two solar cells are respectively provided with a grid line, and the grid line on the front surface of the first solar cell is connected with the grid line on the back surface of the second solar cell by a solder strip, the first solar cell and the second solar cell have an overlapping region, and the overlapping region is provided with a buffer pad covering at least one side surface of the solder strip located in the overlapping region, and the buffer pad is formed by a pad which is pre-arranged in the overlapping region and melted at high temperature.

The embodiments of the present disclosure provide a solar cell string. By arranging a buffer pad covering at least one side surface of a solder strip located in the overlapping region, and the buffer pad is formed by a pad which is pre-arranged in the overlapping region and melted at high temperature, the solder strip will not directly contact both the first solar cell and the second solar cell in the overlapping region at the same time, and the contact between the solar cells will be changed from point contact through the solder strip to surface contact through the buffer pad, and the solar cells are prevented from cracking because of contact stress caused by point contact between the solder strip and two solar cells, and the structure is simple and easy to process. Furthermore, in the embodiment of the present disclosure, the buffer pad is formed by a pad which is pre-arranged in the overlapping region before laminating and melted by laminating, so that the generation efficiency of the buffer pad is improved, and an additional heating process is not needed, which is convenient for processing.

Embodiments of the present disclosure further provide a photovoltaic module including the photovoltaic solar cell string as described in the above embodiments. With the adoption of the photovoltaic solar cell string of the present disclosure, the risk that the contact stress generated by the point contact between the solder strip and the two solar cells causes the solar cell to crack and causes damage to the photovoltaic solar cell string and the photovoltaic module can be avoided.

The embodiments of the present disclosure further provide a manufacturing apparatus of a solar cell string, the apparatus includes: a displacement mechanism, a first conveying mechanism and a second conveying mechanism, the displacement mechanism is used for driving the first conveying mechanism and/or the second conveying mechanism to move; during laying, a solar cell string is transferred from the second conveying mechanism to the first conveying mechanism, and the solar cell string includes a first solar cell and a second solar cell adjacent to each other, the first solar cell and the second solar cell are connected by a solder strip, and the first solar cell and the second solar cell have an overlapping region; when the first solar cell is located on the first conveying mechanism and at least a portion of the second solar cell is located on the second conveying mechanism, the displacement mechanism drives the first conveying mechanism and/or the second conveying mechanism to move so as to separate the first solar cell and the second solar cell in the overlapping region, so as to lay a pad into the overlapping region, thus realizing that a pad is added to the two solar cells in the processing process of serial welding laminating, so as to avoid crack of the solar cells in the laminating progress caused by contact stress generated by point contact between the solder strip and two solar cells, and the structure of this apparatus is simple and easy to process.

The manufacturing apparatus of the present disclosure further includes a heating mechanism for heating at least a portion of the pad after the pad is laid in the overlapping region so as to melt the pad and connect the first solar cell and/or the second solar cell. By preheating the pad to partially melt it, the pad can be prevented from falling off in the subsequent processing process, and the production yield is improved.

The manufacturing apparatus of the present disclosure further includes a laminating device, which includes a laminating plate, a groove is formed in the laminating plate; and the laminating device is used for transmitting the laminating pressure generated by the laminating machine to the first solar cell and the second solar cell, and an overlapping region is formed between the solar cells; when laminating, the laminating plate is arranged on the first solar cell and the second solar cell, and the groove is located above the overlapping region. The laminating device buffers the pressure exerted by the laminating machine, thus avoiding portions of the two solar cells located in the overlapping region from cracking or breaking because of directly bearing the pressure exerted by the laminating machine. The present disclosure also proposes that the width of the groove is greater than the width of the overlapping region, the groove includes a first end and a second end which are oppositely arranged, and the at least two solar cells include a first solar cell and a second solar cell, and the second solar cell is stacked above the first solar cell; when laminating, the second end is located above the first solar cell and the first end is located above the second solar cell. The distance between the first end and the overlapping region is greater than the distance between the second end and the overlapping region. By arranging the groove closer to the upper solar cell, the pressure applied to the upper solar cell can be further buffered, and the solar cell can be prevented from cracking or breaking because of the pressure directly applied by the laminating machine.

For the present disclosure, the following statements should be noted:
(1) The accompanying drawings involve only the structure(s) in connection with the embodiment(s) of the present disclosure, and other structure(s) can be referred to common design(s).
(2) For the sake of clarity, in the drawings for describing embodiments of the present disclosure, the thickness of layers or regions is enlarged or reduced, that is, these drawings are not drawn to actual scale.
(3) In case of no conflict, features in one embodiment or in different embodiments can be combined.

What have been described above are only specific implementations of the present disclosure, the protection scope of the present disclosure is not limited thereto, and the protection scope of the present disclosure should be based on the protection scope of the claims.

The invention claimed is:

1. A manufacturing apparatus of a solar cell string, which is configured to arrange a buffer pad for the solar cell string, wherein the solar cell string comprises at least two solar cells comprising a first solar cell and a second solar cell adjacent to each other, a front surface and a back surface of each of the at least two solar cells are respectively provided with a grid line, the grid line on the front surface of the first solar cell is connected with the grid line on the back surface of the second solar cell by a solder strip, and the first solar cell and the second solar cell have an overlapping region, wherein the manufacturing apparatus comprises:
a solar cell separating mechanism, configured to make a relative movement between the first solar cell and the second solar cell adjacent to each other of the solar cell string, so as to separate the first solar cell and the second solar cell in the overlapping region in a direction perpendicular to a main surface of the first solar cell, so as to lay a pad into the overlapping region.

2. The manufacturing apparatus of a solar cell string according to claim 1, wherein the relative movement between the first solar cell and the second solar cell comprises relative rotation, relative translation or a combination of the relative rotation and the relative translation.

3. The manufacturing apparatus of a solar cell string according to claim 2, wherein the solar cell separating mechanism comprises:
a solar cell conveying device, comprising at least two conveying portions adjacent to each other which are a first conveying portion and a second conveying portion adjacent to each other, wherein an included angle between a conveying surface of the first conveying portion for conveying the at least two solar cells and a conveying surface of the second conveying portion for conveying the at least two solar cells is greater than 90 degrees and less than 180 degrees, so that the solar cell string to be processed travels from the second conveying portion to the first conveying portion along the conveying surfaces of the at least two conveying portions, and when most of the first solar cell is located on the first conveying portion and the second solar cell is not located on the first conveying portion, the first solar cell and the second solar cell in the overlapping region are relatively rotated and separated in a direction perpendicular to a main surface of the second solar cell, so as to lay the pad into the overlapping region.

4. The manufacturing apparatus of a solar cell string according to claim 2, wherein the solar cell separating mechanism comprises:
a solar cell moving device, configured to transfer the solar cell string for laying the pad;
a solar cell pick-up device, comprising at least two pick-up member groups, each of the at least two pick-up member groups comprises one or more pick-up members, each of the at least two pick-up member groups is configured to pick up one of the at least two solar cells, and one of the at least two pick-up member groups are configured to pick up the first solar cell and another of the at least two pick-up member groups are configured to pick up the second solar cell, the one of the at least two pick-up member groups and the another of the at least two pick-up member groups are configured to drive the first solar cell and the second solar cell to move, so that the first solar cell and the second solar cell in the overlapping region are moved relatively with each other along a first direction, so that the first solar cell and the second solar cell are separated in a direction perpendicular to a main surface of the first solar cell, so that the pad is laid into the overlapping region,
wherein the first direction is perpendicular to the main surface of the first solar cell or has an included angle greater than 0 degrees and less than 90 degrees with a perpendicular direction of the main surface of the first solar cell.

5. The manufacturing apparatus of a solar cell string according to claim 4, wherein the pick-up member is a suction member, and the solar cell pick-up device and the solar cell string have relatively movability.

6. The manufacturing apparatus of a solar cell string according to claim 4, wherein each of the at least two pick-up member groups picks up one of the at least two solar cells and drives the one of the at least two solar cells to move along the first direction, the first solar cell is above the second solar cell and the second solar cell is below the first solar cell in a direction perpendicular to the main surface of the first solar cell or the second solar cell, and in a direction away from the manufacturing apparatus along the first direction, a moving distance of the first solar cell is greater than a moving distance of the second solar cell.

7. The manufacturing apparatus of a solar cell string according to claim 2, wherein the solar cell separating mechanism comprises:
   a displacement mechanism, a first conveying mechanism and a second conveying mechanism, wherein the displacement mechanism is used for driving the first conveying mechanism and/or the second conveying mechanism to move;
   during laying the pad, the solar cell string is transferred from the second conveying mechanism to the first conveying mechanism, when the first solar cell is located on the first conveying mechanism and at least a portion of the second solar cell is located on the second conveying mechanism, the displacement mechanism drives the first conveying mechanism and/or the second conveying mechanism to move so as to separate the first solar cell and the second solar cell in the overlapping region in a direction perpendicular to a main surface of the first solar cell, so as to lay the pad into the overlapping region.

8. The manufacturing apparatus of a solar cell string according to claim 1, further comprising:
   a heating mechanism, configured to heat at least a portion of the pad after the pad is laid into the overlapping region, so as to melt the pad and connect the first solar cell and the second solar cell.

9. The manufacturing apparatus of a solar cell string according to claim 7, wherein the first conveying mechanism and the second conveying mechanism comprise a conveyor belt, and the solar cell string is arranged on the conveyor belt, and the conveyor belt drives the solar cell string to move to convey the solar cell string.

10. The manufacturing apparatus of a solar cell string according to claim 7, wherein the displacement mechanism is used for driving the first conveying mechanism to move, and the first conveying mechanism is rotatably connected with the second conveying mechanism;
   when the solar cell string is transferred from the second conveying mechanism to the first conveying mechanism, an included angle of a first preset angle is formed between a plane of the first conveying mechanism on which the solar cell string will be arranged and a horizontal plane, and the included angle of the first preset angle is also formed between a plane of the second conveying mechanism on which the solar cell string is arranged and the horizontal plane, wherein the horizontal plane is a plane which is parallel to a ground plane; and
   when the first solar cell is located on the first conveying mechanism and at least a portion of the second solar cell is located on the second conveying mechanism, the displacement mechanism changes the included angle between the plane of the first conveying mechanism and the horizontal plane from the first present angle to a second preset angle, so that the first solar cell and the second solar cell in the overlapping region are separated.

11. The manufacturing apparatus of a solar cell string according to claim 7, wherein the displacement mechanism is used for driving the first conveying mechanism and the second conveying mechanism to move, when the first solar cell is located on the first conveying mechanism and at least a portion of the second solar cell is located on the second conveying mechanism, the displacement mechanism makes the first conveying mechanism and the second conveying mechanism separate from each other along a first direction, so as to separate the first solar cell and the second solar cell in the overlapping region.

12. The manufacturing apparatus of a solar cell string according to claim 1, further comprising:
   a pad laying mechanism, configured to lay the pad into the overlapping region when the first solar cell and the second solar cell in the overlapping region are separated;
   wherein the pad laying mechanism comprises:
   a feeding mechanism, configured to convey the pad in a first direction, wherein the first direction is a feeding direction of the pad and is perpendicular to an extending direction of the solder strip;
   a cutting mechanism, configured to cut off the pad when a length of the pad meets a preset requirement;
   and a traction mechanism, used for laying the pad to the overlapping region.

13. The manufacturing apparatus of a solar cell string according to claim 7, wherein the first conveying mechanism and the second conveying mechanism comprise a suction structure, and the suction structure is used for fixing the solar cell string on the first conveying mechanism and the second conveying mechanism by using suction.

14. The manufacturing apparatus of a solar cell string according to claim 1, further comprising:
   a laminating device, configured to laminate the solar cell string so that the pad melts and forms the buffer pad covering at least one side surface of the solder strip located in the overlapping region,
   wherein the laminating device comprises:
   a laminating plate, provided with a groove,
   when laminating, the laminating plate is arrange above the first solar cell and the second solar cell, and the groove is arranged above the overlapping region.

15. The manufacturing apparatus of a solar cell string according to claim 14, wherein a width of the groove is larger than a width of the overlapping region, the groove comprises a first end and a second end which are arranged opposite to each other, and the second solar cell is stacked above the first solar cell;
   when laminating, the second end is located above the first solar cell and the first end is located above the second solar cell, and a distance between the first end and the overlapping region is greater than a distance between the second end and the overlapping region.

16. The manufacturing apparatus of a solar cell string according to claim 14, wherein at least two grooves form the groove, the at least two grooves are arranged in at least two columns, an extending direction of each of the at least two columns is along a first direction which is an up and down direction, and the least two columns comprise a first column and a second column adjacent in a second direction, and a position of the groove in the first column is asymmetrical with a position of the groove in the second column, and the first direction is perpendicular to the second direction.

17. The manufacturing apparatus of a solar cell string according to claim 14, wherein the laminating device further comprises:
   a laminating back plate for laminating, wherein the laminating plate is connected with the laminating back plate, and the laminating plate is arranged on the first solar cell and the second solar cell, and the groove of the laminating plate is located above the overlapping region;

when laminating, laminating pressure is transferred from the laminating back plate to the laminating plate, and then transferred from the laminating plate to the first solar cell and the second solar cell.

* * * * *